(12) United States Patent
Kwon et al.

(10) Patent No.: US 11,263,417 B2
(45) Date of Patent: Mar. 1, 2022

(54) ELECTRONIC APPARATUS HAVING FINGERPRINT RECOGNITION FUNCTION

(71) Applicant: Samsung Electronics Co., Ltd., Gyeonggi-do (KR)

(72) Inventors: Oh-Hyuck Kwon, Gyeonggi-do (KR); Hyung-Dal Kim, Gyeonggi-do (KR); Joung-Min Cho, Seoul (KR); Jeong-Min Park, Gyeonggi-do (KR); Hyung-Sup Byeon, Gyeonggi-do (KR); Heung-Sik Shin, Gyeonggi-do (KR)

(73) Assignee: Samsung Electronics Co., Ltd

( * ) Notice: Subject to any disclaimer, the term of this patent is extended or adjusted under 35 U.S.C. 154(b) by 20 days.

(21) Appl. No.: 16/479,077

(22) PCT Filed: Jan. 3, 2018

(86) PCT No.: PCT/KR2018/000124
§ 371 (c)(1),
(2) Date: Jul. 18, 2019

(87) PCT Pub. No.: WO2018/135780
PCT Pub. Date: Jul. 26, 2018

(65) Prior Publication Data
US 2019/0384960 A1   Dec. 19, 2019

(30) Foreign Application Priority Data
Jan. 18, 2017  (KR) .......................... 10-2017-0008818

(51) Int. Cl.
*G06K 9/00*  (2006.01)
*H01L 27/12*  (2006.01)
*H01L 27/32*  (2006.01)

(52) U.S. Cl.
CPC ...... *G06K 9/00013* (2013.01); *H01L 27/1214* (2013.01); *H01L 27/3244* (2013.01)

(58) Field of Classification Search
CPC .. G06K 9/0004; G06K 9/00013; G06F 3/042; G06F 2203/0338
See application file for complete search history.

(56) References Cited

U.S. PATENT DOCUMENTS

2002/0074551 A1* 6/2002 Kimura ................... G06F 3/042
                                                        257/72
2008/0121442 A1* 5/2008 Boer ...................... G06F 3/0421
                                                        178/18.09
(Continued)

FOREIGN PATENT DOCUMENTS

JP       2002159052      5/2002
KR    1020120124369     11/2012
(Continued)

OTHER PUBLICATIONS

PCT/ISA/210 Search Report issued on PCT/KR2018/000124, pp. 5.
PCT/ISA/237 Written Opinion issued on PCT/KR2018/000124, pp. 5.

*Primary Examiner* — Yuzhen Shen
(74) *Attorney, Agent, or Firm* — The Farrell Law Firm, P.C.

(57) ABSTRACT

An electronic apparatus according to a variety of embodiments of the present invention may comprise: a display panel comprising a display which comprises one or more first pixels, one or more second pixels, and one or more first wires connected to the one or more first pixels and second pixels, and one or more fingerprint sensors which are disposed between the one or more first pixels and one or more second pixels; and a wiring layer comprising one or more second wires connected to the one or more fingerprint sensors by wiring between the layers, A variety of other embodiments are possible.

14 Claims, 22 Drawing Sheets

(56) References Cited

U.S. PATENT DOCUMENTS

| | | | | |
|---|---|---|---|---|
| 2009/0141004 | A1* | 6/2009 | Yamazaki | G06F 3/0412 345/175 |
| 2010/0007632 | A1* | 1/2010 | Yamazaki | G06F 21/32 345/175 |
| 2011/0096047 | A1* | 4/2011 | Endo | H01L 27/3269 345/207 |
| 2011/0181786 | A1* | 7/2011 | Yamazaki | G09G 3/3275 348/671 |
| 2011/0248970 | A1* | 10/2011 | Koyama | G06F 3/042 345/204 |
| 2011/0267298 | A1* | 11/2011 | Erhart | G06F 1/1684 345/173 |
| 2013/0176283 | A1* | 7/2013 | Nakata | G06F 3/03545 345/175 |
| 2014/0340363 | A1* | 11/2014 | Ikeda | G06F 3/0412 345/175 |
| 2014/0354596 | A1 | 12/2014 | Djordjev et al. | |
| 2015/0177884 | A1 | 6/2015 | Han | |
| 2016/0171281 | A1 | 6/2016 | Park et al. | |
| 2016/0266695 | A1 | 9/2016 | Bae et al. | |
| 2016/0350571 | A1 | 12/2016 | Han et al. | |
| 2017/0323135 | A1 | 11/2017 | Kang et al. | |
| 2017/0351364 | A1 | 12/2017 | Kim et al. | |
| 2018/0046837 | A1* | 2/2018 | Gozzini | G06K 9/0004 |

FOREIGN PATENT DOCUMENTS

| | | |
|---|---|---|
| KR | 1020150073539 | 7/2015 |
| KR | 1020150107071 | 9/2015 |
| KR | 1020160016969 | 2/2016 |
| KR | 1020160057324 | 5/2016 |
| KR | 1020160059342 | 5/2016 |
| KR | 1020160071887 | 6/2016 |
| KR | 1020160141180 | 12/2016 |
| WO | WO 2016144108 | 9/2016 |

* cited by examiner

ELECTRONIC APPARATUS HAVING FINGERPRINT RECOGNITION FUNCTION

CROSS-REFERENCE TO RELATED APPLICATION(S)

This application is a National Phase Entry of PCT International Application No. PCT/KR2018/000124, which was filed on Jan. 3, 2018, and claims priority to Korean Patent Application No. 10-2017-0008818, which was filed on Jan. 18, 2017, the contents of which are incorporated herein by reference.

BACKGROUND

1. Field

Various embodiments of the disclosure relate to an electronic device having a fingerprint recognition function.

2. Description of the Related Art

An electronic device may include a display and an input button. Through a fingerprint sensor for recognizing fingerprint information, an electronic device may be used to detect fingerprint information on a part of a user's body.

SUMMARY

An inconvenience may arise in that it is necessary for the user to perform a separate input on a fingerprint sensor in order to detect or authenticate fingerprint information. For example, since it is necessary for the user to place the fingerprint accurately at the position where the fingerprint sensor is disposed, inconvenience may arise in use, and when a portion of the fingerprint deviates from the position of the fingerprint sensor, the fingerprint recognition rate may deteriorate. Furthermore, the size of the display may be limited due to the area occupied by the input button in the face on which the display of the electronic device is disposed.

According to various embodiments, when fingerprint sensors are mounted inside the display, enlargement of the display is achieved by excluding the input button from the face on which the display is disposed.

According to various embodiments, the fingerprint sensors may be mounted inside the display such that the entire display active area can be utilized to recognize a fingerprint.

An electronic apparatus according to a variety of embodiments of the disclosure may include: a display panel including a display which includes one or more first pixels, one or more second pixels, one or more first wires connected to the one or more first pixels and the one or more second pixels, and one or more fingerprint sensors which are disposed between the one or more first pixels and the one or more second pixels; and a wiring layer including one or more second wires connected to the one or more fingerprint sensors by wiring between the layers.

According to various embodiments of the disclosure, an electronic device having a fingerprint recognition function may include: a window; a display panel disposed on a lower face of the window and including multiple pixels; multiple fingerprint sensors provided in the display panel and arranged between the pixels; a wiring layer disposed on a lower face of the display panel and including second wiring lines connected to the multiple fingerprint sensors; and a fingerprint sensor drive circuit connected to the multiple fingerprint sensors via the second wiring lines.

According to various embodiments of the disclosure, a method of manufacturing an electronic device having a fingerprint recognition function may include: an operation of arranging conductive lines on a film; an operation of forming a TFT layer above the film through a Low-Temperature Poly Silicon (LTPS) process; an operation of forming a cathode layer above the TFT layer; an operation of forming interlayer wiring lines in the TFT layer or the cathode layer in order to electrically connect the TFT layer or the cathode layer to the conductive lines; an operation of arranging connection lines connected to the interlayer wires; an operation of arranging multiple pixels on the film; an operation of arranging fingerprint sensors connected to the connection lines between the multiple pixels; and an operation of forming an anode layer above the multiple pixels.

In a display according to various embodiments of the disclosure and an electronic device having the same, since multiple fingerprint sensors are arranged between multiple pixels, a fingerprint can be recognized anywhere on the entire display, unlike the conventional electronic devices in which a fingerprint is only recognized at a specific position. According to various embodiments of the disclosure, since the entire display is utilized to recognize a fingerprint, the fingerprint recognition rate can be improved.

According to various embodiments of the disclosure, since a separate input button for a fingerprint sensor is not required, and since the entire front surface of the electronic device is utilized as a display, it is possible to enlarge the display.

DETAILED DESCRIPTION

Figure 1A:
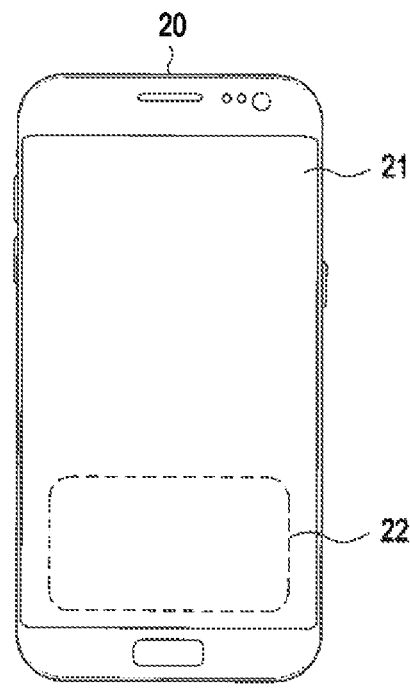
FIGS. 1A and 1B illustrate an exemplary electronic device according to various embodiments of the disclosure.

Hereinafter, various embodiments of the disclosure will be described with reference to the accompanying drawings. The embodiments and the terms used therein are not intended to limit the technology disclosed herein to specific forms, and should be understood to include various modifications, equivalents, and/or alternatives to the corresponding embodiments. In describing the drawings, similar reference numerals may be used to designate similar constituent elements. A singular expression may include a plural expression unless they are definitely different in a context. As used herein, singular forms may include plural forms as well unless the context clearly indicates otherwise. The expression "a first", "a second", "the first", or "the second" may modify various components regardless of the order and/or the importance, and is used merely to distinguish one element from any other element without limiting the corresponding elements. When an element (e.g., first element) is referred to as being "(functionally or communicatively) connected," or "directly coupled" to another element (second element), the element may be connected directly to the another element or connected to the another element through yet another element (e.g., third element).

The expression "configured to" as used in various embodiments of the disclosure may be interchangeably used with, for example, "suitable for", "having the capacity to", "designed to", "adapted to", "made to", or "capable of" in terms of hardware or software, according to circumstances. Alternatively, in some situations, the expression "device configured to" may mean that the device, together with other devices or components, "is able to". For example, the phrase "processor adapted (or configured) to perform A, B, and C" may mean a dedicated processor (e.g., embedded processor) only for performing the corresponding operations or a generic-purpose processor (e.g., Central Processing Unit (CPU) or Application Processor (AP)) that can perform the corresponding operations by executing one or more software programs stored in a memory device.

An electronic device according to various embodiments of the disclosure may include at least one of, for example, a smart phone, a tablet Personal Computer (PC), a mobile phone, a video phone, an electronic book reader (e-book reader), a desktop PC, a laptop PC, a netbook computer, a workstation, a server, a Personal Digital Assistant (PDA), a Portable Multimedia Player (PMP), an MPEG-1 audio layer-3 (MP3) player, a mobile medical device, a camera, and a wearable device. According to various embodiments, the wearable device may include at least one of an accessory type (e.g., a watch, a ring, a bracelet, an ankle bracelet, a necklace, a pair of glasses, a contact lens, or a Head-Mounted Device (HMD)), a fabric or clothing integrated type (e.g., an electronic clothing), a body-mounted type (e.g., a skin pad, or tattoo), and a bio-implantable type (e.g., an implantable circuit). In some embodiments, the electronic device may include at least one of, for example, a television, a Digital Video Disk (DVD) player, an audio player, a refrigerator, an air conditioner, a vacuum cleaner, an oven, a microwave oven, a washing machine, an air cleaner, a set-top box, a home automation control panel, a security control panel, a TV box (e.g., Samsung HomeSync™, Apple TV™, or Google TV™), a game console (e.g., Xbox™ and PlayStation™), an electronic dictionary, an electronic key, a camcorder, and an electronic photo frame.

In other embodiments, the electronic device may include at least one of various medical devices (e.g., various portable medical measuring devices (a blood glucose monitoring device, a heart rate monitoring device, a blood pressure measuring device, a body temperature measuring device, etc.), a Magnetic Resonance Angiography (MRA), a Magnetic Resonance Imaging (MRI), a Computed Tomography (CT) machine, and an ultrasonic machine), a navigation device, a Global Positioning System (GPS) receiver, an Event Data Recorder (EDR), a Flight Data Recorder (FDR), a Vehicle Infotainment Devices, an electronic device for a ship (e.g., a navigation device for a ship, and a gyro-compass), avionics, security devices, an automotive head unit, a robot for home or industry, an Automatic Teller's Machine (ATM) in banks, a Point Of Sale (POS) in a shop, or internet device of things (e.g., a light bulb, various sensors, electric or gas meter, a sprinkler device, a fire alarm, a thermostat, a streetlamp, a toaster, a sporting goods, a hot water tank, a heater, a boiler, etc.). According to some embodiments, an electronic device may include at least one of a part of furniture or a building/structure, an electronic board, an electronic signature receiving device, a projector, and various types of measuring instruments (e.g., a water meter, an electric meter, a gas meter, a radio wave meter, and the like). In various embodiments, the electronic device may be flexible, or may be a combination of one or more of the aforementioned various devices. The electronic device according to one embodiment of the disclosure is not limited to the above described devices. In the disclosure, the term "user" may refer to a person using an electronic device or a device (for example, an artificial intelligence electronic device) using an electronic device.

Figure 1B:
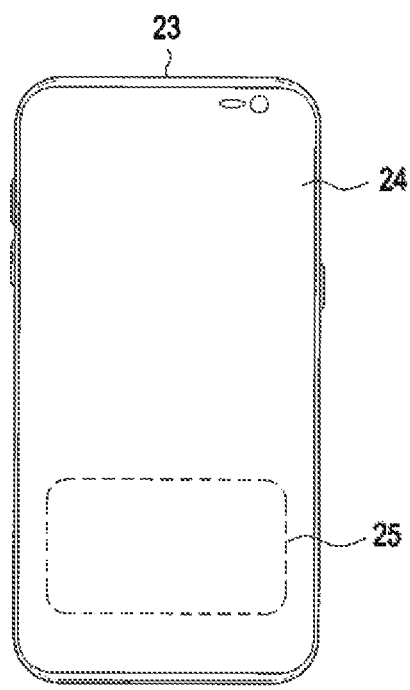

FIGS. 1A and 1B illustrate an exemplary electronic device 20 or 23 according to various embodiments of the disclosure.

Referring to FIG. 1A, the electronic device 20 may include a biosensor 22 (e.g., a fingerprint sensor) disposed on at least a part of a display 21 to recognize biometric information (e.g., fingerprint information). Since the biosensor 22 is disposed in at least a part of the display 21 (e.g., in the active area or Black Matrix (BM) area of the display), it is possible to obtain biometric information for the user using the user input on the display 21. The display active area may be an area in which actual display pixels are implemented to display information. Since the biosensor 22 (e.g., a fingerprint sensor) is disposed in the active area of the display, it is possible to use most of the front face of the electronic device 20 as a display.

Referring to FIG. 1B, the electronic device 23 may include a biosensor 25 (e.g., a fingerprint sensor) in at least a portion of the display 24 so that the area occupied by the biosensor 25 can be formed as the display 24 to extend the size of the display.

Figure 2:
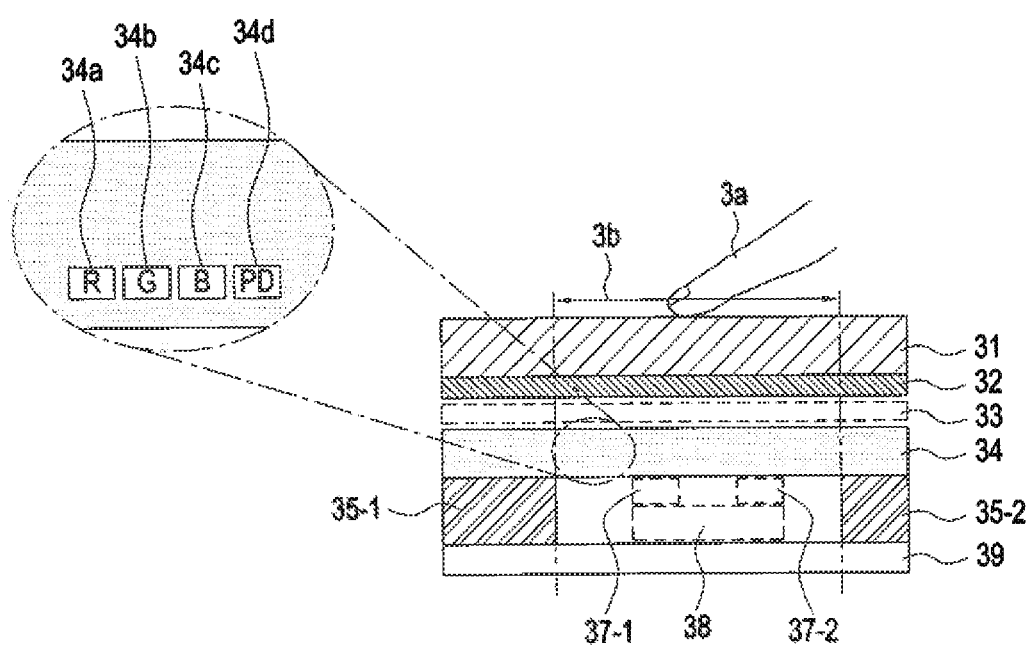
FIG. 2 illustrates an exemplary biosensor mounting structure provided in at least a part of a display of an electronic device according to various embodiments of the disclosure.

FIG. 2 illustrates an exemplary mounting structure of a biosensor (e.g., a fingerprint sensor 33, a fingerprint sensor 34d or a fingerprint sensor 38 in FIG. 2) provided in at least a portion of the display 34 of an electronic device (e.g., the electronic device 20 or 23 of FIG. 1) according to various embodiments of the disclosure in order to obtain the biometric information of the user 3a. According to an embodiment, the electronic device may include glass 31, the fingerprint sensor 33, a display 34, the fingerprint sensor 38, or a PCB 39. The glass 31 may be adhered to the fingerprint sensor 33 or the display 34 via an adhesive layer 32. According to an embodiment, the electronic device may further include structures 35-1 and 35-2 for securing the mounting space of fingerprint sensor 38. At this time, the structures 35-1 and 35-2 may form at least a portion of a sealing structure for protecting the fingerprint sensor 38.

According to an embodiment, the fingerprint sensor 33 and 38 are disposed in a portion of the display 34 (e.g., one or more areas) or over the entire area of the display (e.g., the active area of the display).

According to an embodiment, the fingerprint sensor 33 and 34d capable of detecting biometric information may be disposed on a separate layer on the one face of the display or at least a portion of a face in which the pixels 34a to 34c of the display are disposed. According to an embodiment, the fingerprint sensor 33 and 34d of an electrostatic capacity type may be implemented in an electrostatic capacity by forming an electrostatic capacity type transmission/reception electrode pattern on the display (e.g., on the separate layer on the display, or directly on the upper face of the display). According to another embodiment, the fingerprint sensor 33 and 34d of an ultrasonic type may be implemented in an ultrasonic by disposing an ultrasonic type transmitter/receiver on the separate layer.

According to an embodiment, the fingerprint sensor 38 may be disposed on the other face (e.g., the rear face) of the display. The fingerprint sensors 33, 34d, and 38 may include, for example, an optical image sensor, an ultrasonic type transmission/reception module, or an electrostatic capacity type transmission/reception electrode pattern. According to another embodiment, the electronic device may include the fingerprint sensor 38 below the display. According to an embodiment, the fingerprint sensor 38 may be configured as an optical fingerprint sensor configured to detect a fingerprint of a user using the light emitted from the display 34 (e.g., the light emitted from R, G, or B pixels of the display, or a light source separately implemented inside the display (e.g., IR or LED)) as a light source.

According to various embodiments, the fingerprint sensor 33 may be formed between the adhesive layer 32 and the display 34, or between the window glass 31 and the adhesive layer 32. According to an embodiment, the fingerprint sensor 33 of the electrostatic capacity type may be formed as an electrostatic capacity type transmission/reception electrode pattern, and may be formed as transparent electrodes in order to increase the transmittance of light output from the display 34. According to an embodiment, the fingerprint sensor 33 of the ultrasonic type may also include an ultrasonic type transmission/reception module.

According to various embodiments, the electronic device may have the fingerprint sensor 38 disposed on the other face of the display. Between the fingerprint sensor 38 and the display 34, shock absorption portions 37-1 and 37-2 (e.g., sponge or rubber) may be disposed to alleviate an impact between the fingerprint sensor 38 and the display 34 or to prevent the entry of foreign matter. According to an embodiment, the fingerprint sensor 38 may include an image sensor. For example, the image sensor may output light (e.g., visible light, or infrared or ultraviolet light) emitted from a light source (e.g., the light emitted from R, G, or B pixels of the display 34 or an IR LED) to the user's fingerprint, so that the light reflected from the user's fingerprint can be detected by the image sensor.

According to various embodiments, the electronic device may include the fingerprint sensor 33, a fingerprint sensor 34d or the fingerprint sensor 38 in at least a designated area (e.g., a fingerprint-sensing area 3b) of the display 34, so that the biometric information of the user can be detected through the designated area. According to various embodiments, the fingerprint-sensing area 3b may be the display 24 in FIG. 1B. According to various embodiments, the designated area may be the entire area of the display (e.g., the active area).

According to various embodiments, the electronic device may acquire the touch input of the user by controlling the fingerprint sensor without including a separate touch sensor.

Figure 3:
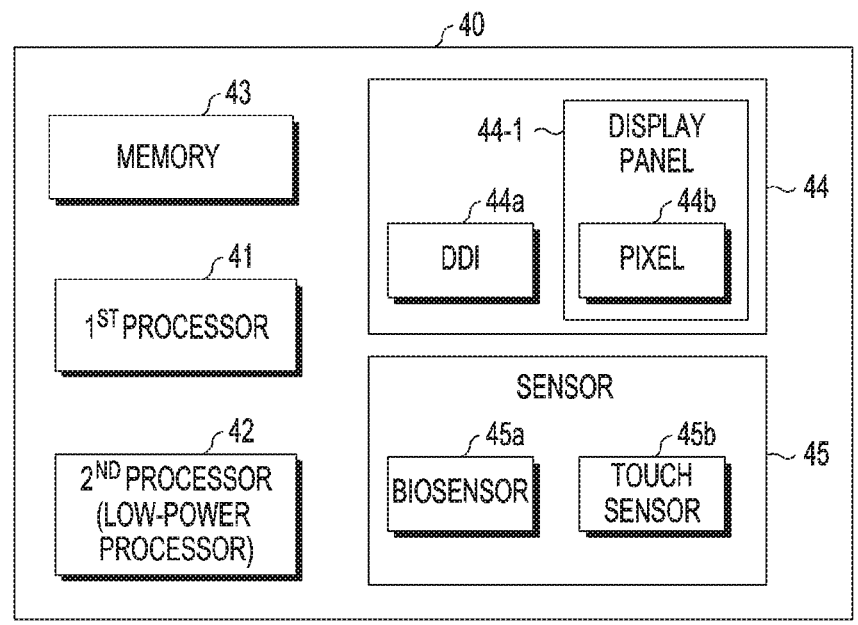
FIG. 3 illustrates a view illustrating an exemplary electronic device according to various embodiments of the disclosure.

FIG. 3 illustrates a view illustrating an exemplary electronic device 40 according to various embodiments of the disclosure.

Referring to FIG. 3, the electronic device may include at least one processor (e.g., a first processor 41 or a second processor 42), memory 43, a display 44, or at least one sensor 45. According to an embodiment, the first processor 41 may control the overall operation of the electronic device. When the electronic device is in the sleep state, the second processor 42 (e.g., a low-power processor or a sensor HUB) may process sensor information acquired through the at least one sensor 45 or the input acquired from the user without driving the first processor 41. According to an embodiment, the second processor 42 may control the biosensor 45a (e.g., a fingerprint sensor), the touch sensor 45b, or the display 44 independently of the first processor 41. The electronic device according to an embodiment may include the memory 43. The memory 43 may include a general area for storing a user application or the like, a security area for storing information sensitive to security such as information for fingerprint-sensing, or an area for improving the performance of fingerprint acquisition through a method of partially controlling a part of a circuit inside the display 44 in which a fingerprint sensor is built. According to an embodiment, the electronic device may include a structure for changing or correcting an area of the display pixel structure in order to obtain a correct and clear image when an image sensor is mounted on the rear side of the display and the image of a fingerprint transmitted from the display is acquired.

According to an embodiment, the display 44 may include a display panel 44-1 including multiple pixels 44b and a display drive circuit (e.g., a Display Driver IC (DDI)) 44a set to provide display information by controlling at least some of the multiple pixels 44b included in the display panel 44-1. According to an embodiment, the sensor 45 may include a biosensor 45a (e.g., a fingerprint sensor) for sensing a fingerprint of a user on the display 44 or a touch sensor 45b for sensing the user's touch on the display 44. According to an embodiment, the biosensor 45a may include an optical fingerprint sensor (e.g., an image sensor) that uses light output from the display 44 as a light source. For this purpose, the biosensor 45a (e.g., a fingerprint sensor) may directly control the display 44 through the display drive circuit 44a to acquire fingerprint information.

According to various embodiments, the at least one sensor 45 may drive the multiple pixels 44b included in the display panel 44-1 through the display drive circuit 44a in response to the user's input. According to an embodiment, the at least one sensor 45 may control the multiple pixels 44b as needed. For example, the biosensor 45a (e.g., a fingerprint sensor) may use the light emitted from the display by controlling the multiple pixels 44b in order to acquire biometric information of the user.

Figure 4:
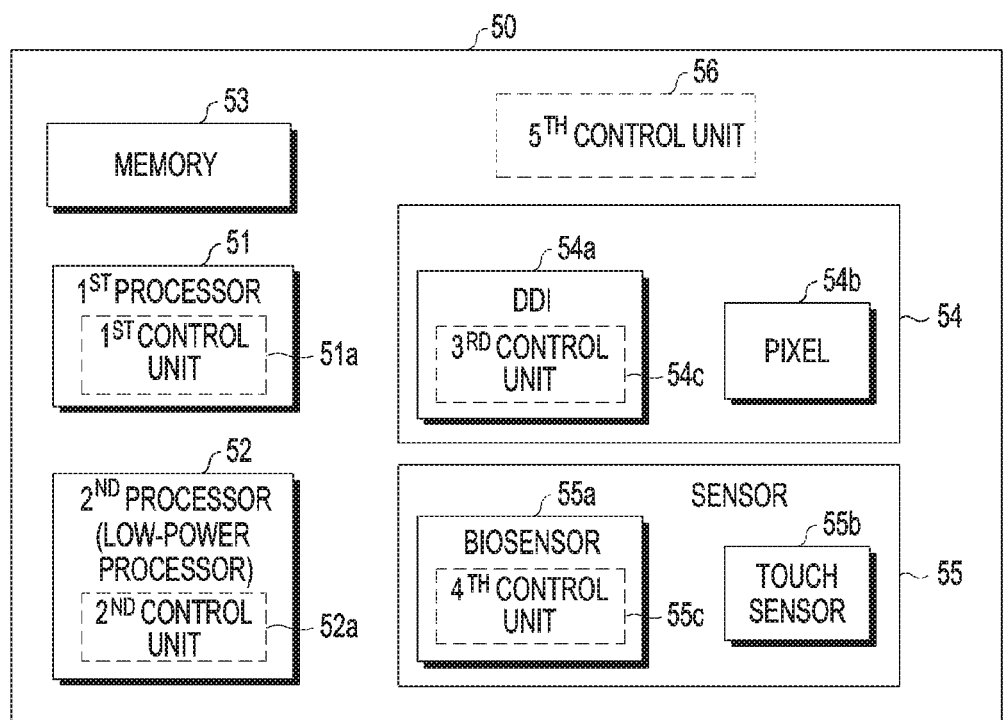
FIG. 4 illustrates another exemplary electronic device according to various embodiments of the disclosure.

FIG. 4 illustrates another exemplary electronic device 50 according to various embodiments of the disclosure.

Referring to FIG. 4, the electronic device may include multiple controllers (e.g., a first control unit 51a, a second control unit 52a, a third control unit 54c, a fourth control unit 55c, or a fifth control unit 56), and each controller may be included in a module (e.g., a first processor 51, a second processor 52, a DDI 54a, or a biosensor 55a (e.g., a fingerprint sensor)) included in the electronic device. For example, the electronic device may control the first processor 51 using the first control unit 51a and the second processor 52 using the second control unit 52a. In addition, using the third control unit 54c and the fourth control unit 55c, the electronic device may control the modules in which the third control unit 54c and the fourth control unit 55c are included.

According to an embodiment, the modules of the electronic device may be controlled using a single controller. For example, the electronic device may control the multiple controllers (e.g., the first control unit 51a, the second control unit 52a, the third control unit 54c, and the fourth control unit 55c) using a main controller (e.g., a fifth control unit 56). In addition, the electronic device may designate the main controller, and may control other controllers via the designated main controller. For example, the electronic device may change/designate the main controller from the fifth control unit 56 to the first control unit 51a, and may control other controllers using the designated main controller.

According to an embodiment, the electronic device may directly control the modules using a single controller. For example, the electronic device may control a second processor 52, memory 53, a display 54, and/or at least one sensor 55 using the first control unit 51a included in the first processor 51. According to another embodiment, the display 54 and the at least one sensor 55 may be controlled by a single controller. For example, in the case of an optical fingerprint sensor using the display 54 as a light source, the display 54 and the sensor 55 may be controlled using a single controller, and the biometric information of the user can be easily acquired.

Figure 5:
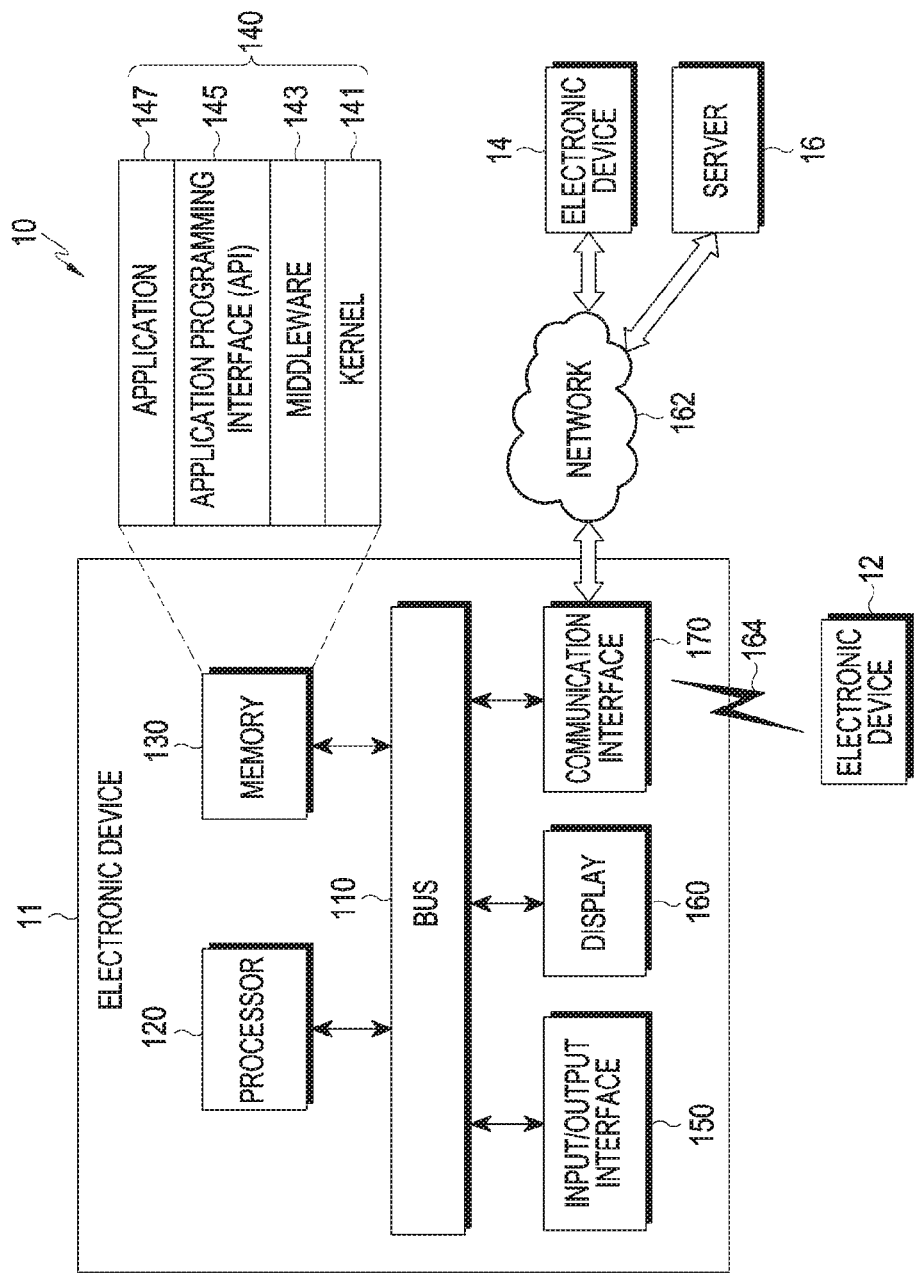
FIG. 5 is a schematic view illustrating an electronic device according to various embodiments of the disclosure within a network environment.

An electronic device 11 according to various embodiments in a network environment 10 will be described with reference to FIG. 5. The electronic device 11 may include a bus 110, a processor 120, a memory 130, an input/output interface 150, a display 160, and a communication interface 170. In some embodiments, at least one of the above-mentioned components may be omitted from the electronic device 11, or the electronic device 11 may additionally include other components. The bus 110 may include a circuit that interconnects the above-mentioned components 110 to 170 and transfers communication information (e.g., a control message or data) between the components 110 to 170. The processor 120 may include one or more of a Central Processing Unit (CPU), an Application Processor (AP), and a Communication Processor (CP). The processor 120 may execute, for example, an arithmetic operation or data processing that is related to the control and/or communication of one or more other components of the electronic device 11.

The memory 130 may include volatile memory and/or nonvolatile memory. The memory 130 may store, for example, instructions or data that are related to one or more other components of the electronic device 11. According to an embodiment, the memory 130 may store software and/or a program 140. The program 140 may include, for example, kernel 141, middleware 143, an Application Programming Interface (API) 145, and/or an application program (or an "application") 147. At least one of the kernel 141, the middleware 143, and the API 145 may be referred to as an Operating System (OS). The kernel 141 may control or manage, for example, system resources (e.g., the bus 110, the processor 120, and the memory 130) that are used for executing operations or functions implemented in the other programs (e.g., the middleware 143, the API 145, or the application 147). In addition, the kernel 141 may provide an interface that allows the middleware 143, the API 145, or the application 147 to access individual components of the electronic device 11 so as to control or manage the system resources.

The middleware 143 may play an intermediary role such that, for example, the API 145 or the application 147 is capable of communicating with the kernel 141 so as to exchange data. In addition, the middleware 143 may process one or more task requests which are received from the applications 147, according to priority. For example, the middleware 143 may assign priority to be capable of using a system resource of the electronic device 11 (e.g., the bus 110, the processor 120, or the memory 130) to at least one of the applications 147, and may process the one or more task requests. The API 145 is, for example, an interface that allows the applications 147 to control functions provided from the kernel 141 or the middleware 143, and may include, for example, one or more interfaces or functions (e.g., commands) for a file control, a window control, an image processing, or a character control. The input/output interface 150 may transmit commands or data, which are entered from, for example, a user or any other external device, to the other component(s) of the electronic device 11, or may output commands or data, which are received from the other component(s) of the electronic device 11, to the user or the other external device.

The display 160 may include, for example, a Liquid Crystal Display (LCD), a Light Emitting Diode (LED) display, an Organic Light-Emitting Diode (OLED) display, a MicroElectroMechanical System (MEMS) display, or an electronic paper display. The display 160 may display various kinds of content (e.g., text, image, video, icon, or symbol) to, for example, the user. The display 160 may include a touch screen, and may receive a touch input, a gesture input, a proximity input, or a hovering input that is made using, for example, an electronic pen or a part of the user's body. The communication interface 170 may set, for example, communication between the electronic device 11 and an external device (e.g., a first external electronic device 12, a second external device 14, or a server 16). For example, the communication interface 170 may be connected with a network 162 through wired or wireless communication so as to communicate with the external device (e.g., the second external electronic device 14 or the server 16).

The wireless communication may include cellular communication that uses at least one of, for example, Long-Term Evolution (LTE), LTE Advance (LTE-A), Code Division Multiple Access (CDMA), Wideband CDMA (WCDMA), Universal Mobile Telecommunication System (UMTS), Wireless Broadband (WiBro), and Global System for Mobile communication (GSM). According to an embodiment, the wireless communication may include at least one of, for example, Wireless Fidelity (Wi-Fi), Bluetooth, Bluetooth Low Energy (BLE), ZigBee, Near-Field Communication (NFC), Magnetic Secure Transmission, Radio Frequency (RF), or Body Area Network (BAN). According to an embodiment, the wireless communication may include GNSS. The GNSS may be, for example, at least one of Global Positioning System (GPS), Global Navigation Satellite System (GLONSS), Beidou Navigation Satellite System (hereinafter, "Beidou"), Galileo, or the European global satellite-based navigation system. Herein, "GPS" may be interchangeably used with "GNSS" below. The wired communication may use at least one of, for example, Universal Serial Bus (USB), High-Definition Multimedia Interface (HDMI), Recommended Standard 232 (RS-232), power line communication, and Plain Old Telephone Service (POTS). The network 162 may include a telecommunications network (e.g., at least one of a computer network (e.g., LAN or WAN), the Internet, or a telephone network).

Each of the first and second external electronic devices 12 and 14 may be of a type, which is the same as or different from the electronic device 11. According to various embodiments, all or some of the operations to be executed by the electronic device 11 may be executed in another electronic device or other multiple electronic devices (e.g., the electronic devices 12 and 14 or the server 16). According to an embodiment, in the case where the electronic device 11 should perform certain functions or services automatically or in response to a request, the electronic device 11 may request some functions or services that are associated therewith from other electronic devices (e.g., the electronic devices 12 and 14 or the server 16), instead of, or in addition to, executing the functions or services by itself. The other electronic devices (e.g., the electronic devices 12 and 14 or the server 16) may execute the requested functions or additional functions, and may deliver the results to the electronic device 11. The electronic device 11 may provide requested functions or services using the received results as they are or by additionally processing the received results. For this purpose, for example, a cloud computing technology, a distributed computing technology, or a client-server computing technology may be used.

Figure 6:
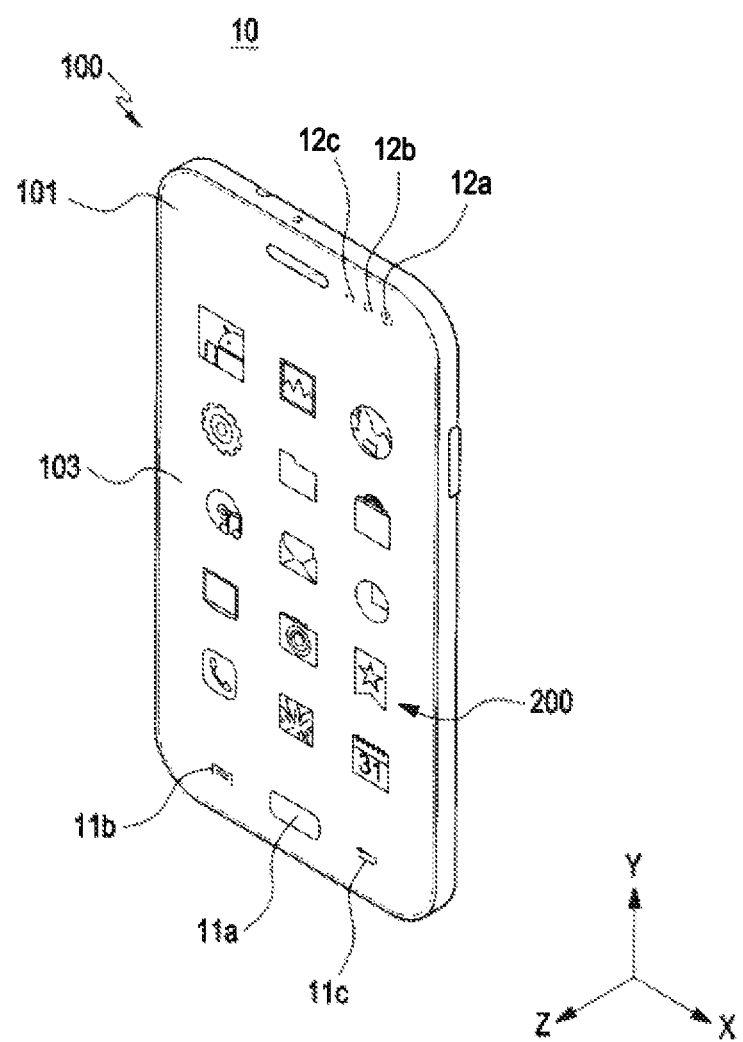
FIG. 6 is a perspective view illustrating the front side of an electronic device including a display according to various embodiments of the disclosure.
Figure 7:
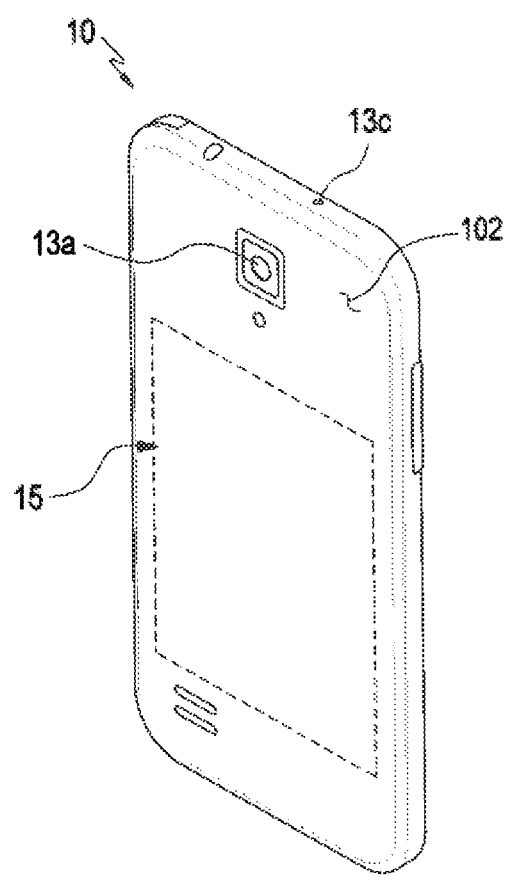
FIG. 7 is a perspective view illustrating the rear side of an electronic device that includes a display according to various embodiments of the disclosure.

FIG. 6 is a perspective view illustrating the front side of an electronic device including a display according to various embodiments of the disclosure. FIG. 7 is a perspective view illustrating the rear side of an electronic device that includes a display according to various embodiments of the disclosure.

In FIG. 6, in an orthogonal coordinate system of three axes, the "X axis" may correspond to the width direction of the electronic device 10, the "Y axis" may correspond to the length direction of the electronic device 10, and the "Z axis" may correspond to the thickness direction of the electronic device 10.

As illustrated in FIGS. 6 and 7, the electronic device 10 may include a housing 100 and a display 200. The housing 100 may include a first face 101 oriented in a first (+Z) direction and a second face 102 oriented in a second (−Z) direction that is opposite the first (+Z) direction. The front face of the housing 100 may be open, and a transparent cover 103 may be mounted to form at least a portion of the first face 101 so as to close the open front face of the housing 100. As another example, substantially the entire area of the transparent cover 103 (e.g., the total area excluding an inactive area extending by 0.1 mm to 5 mm from at least one boundary of the transparent cover 103) may overlap the display 200. For example, when viewed from above the transparent cover 103, the display 200 may be disposed over the entire front face of the electronic device 10.

According to an embodiment, the electronic device 10 may be provided with a keypad including mechanically operating buttons or touch keys 11a, 11b, and 11c in one side area of the transparent cover 103 on the front face of the housing 100. The touch key may generate an input signal when a user's body touches the touch key. According to various embodiments, the keypad may be implemented only with mechanical buttons, or only with touch keys. Various types of circuit devices, such as the processor 120, the memory 130, the input/output interface 150, and the communication interface 170, which are described above, may be accommodated in the housing 100, and a battery 15 may be accommodated in the housing 100 so as to secure a power source.

According to an embodiment of the disclosure, a first camera 12a, an illuminance sensor 12b, or a proximity sensor 12c may be included in the upper end area of the front face of the electronic device 10. In still another example, a second camera 13a, a flash 13b, or a speaker 13c may be included on the rear face of the electronic device 10. According to various embodiments, when the display 200 is disposed over the entire front face of the electronic device 10, the first camera 12a, the illuminance sensor 12b, or the proximity sensor 12c may be integrated within the display 200, or may be disposed on the rear face of the display 200.

Figure 8:
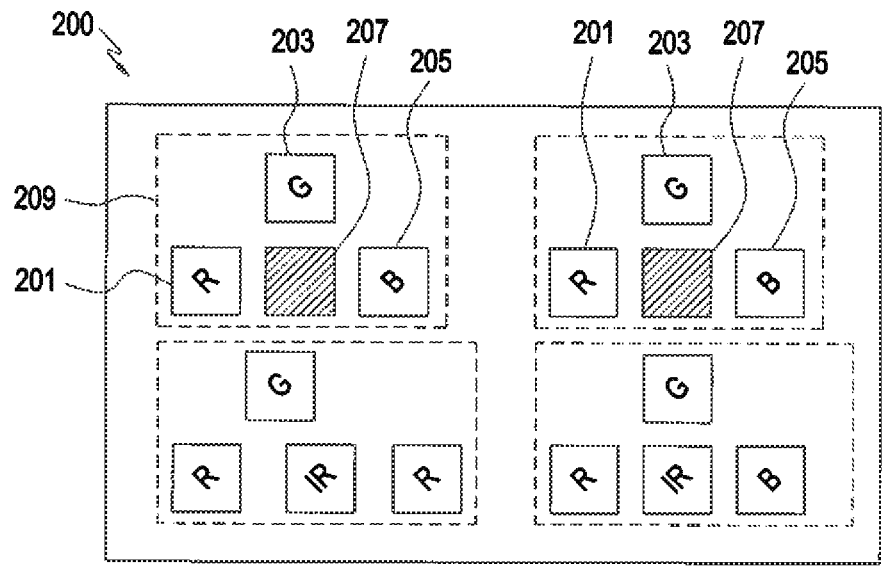
FIG. 8 is a plan view illustrating multiple pixels and multiple fingerprint sensors disposed in a display according to one of various embodiments of the disclosure.

FIG. 8 is a plan view illustrating multiple pixels and multiple fingerprint sensors disposed in a display according to various embodiments of the disclosure.

Referring to FIG. 8, according to various embodiments of the disclosure, the display 200 may include multiple pixels 201, 203, and 205 and multiple fingerprint sensors 207.

According to an embodiment of the disclosure, the multiple pixels 201, 203, and 205 may output one of red, green, and blue colors. For example, the multiple pixels 201, 203, and 205 may have a rectangular shape, and may include first pixels 201, second pixels 203, and third pixels 205. For example, the first pixels 201 may output a red color, the second pixels 203 may output a green color, and the third pixels 205 may output a blue color.

According to an embodiment of the disclosure, each of the multiple fingerprint sensors 207 may be an ultrasonic fingerprint sensor that senses the fingerprint of a user using ultrasonic waves. For example, the ultrasonic fingerprint sensor may be formed of an ultrasonic type transmitter/receiver. According to an embodiment of the disclosure, the multiple fingerprint sensors 207 may include a transmission/reception module or an electrostatic capacity type transmission/reception electrode pattern. According to an embodiment of the disclosure, the multiple fingerprint sensors 207 of an electrostatic capacity type may be implemented in an electrostatic capacity by forming electrodes that are sensible by the display 200. According to an embodiment of the disclosure, the multiple fingerprint sensors 207 may be implemented as optical fingerprint sensors that sense the fingerprint of a user using light emitted from the display 200. The emitted light may be light output from multiple pixels 201, 203, and 205 or may be light emitted from a light source (e.g., an IR LED, etc.) separately implemented in the display 200.

According to an embodiment of the disclosure, the multiple fingerprint sensors 207 may be disposed to be surrounded by the multiple pixels 201, 203, and 205. For example, three pixels 201, 203, and 205 may be disposed around each of the multiple fingerprint sensors 207. The first pixel 201, the second pixel 203, the third pixel 205, and the fingerprint sensor 207 form one pattern 209, and the pattern 209 may be repeatedly formed on the display 200. According to an embodiment of the disclosure, the number of pixels 201, 203, and 205 surrounding each of the multiple fingerprint sensors 207 is not limited to three, and the multiple fingerprint sensors 207 may be disposed between the multiple pixels 201 and 203 in various patterns.

Figure 9:
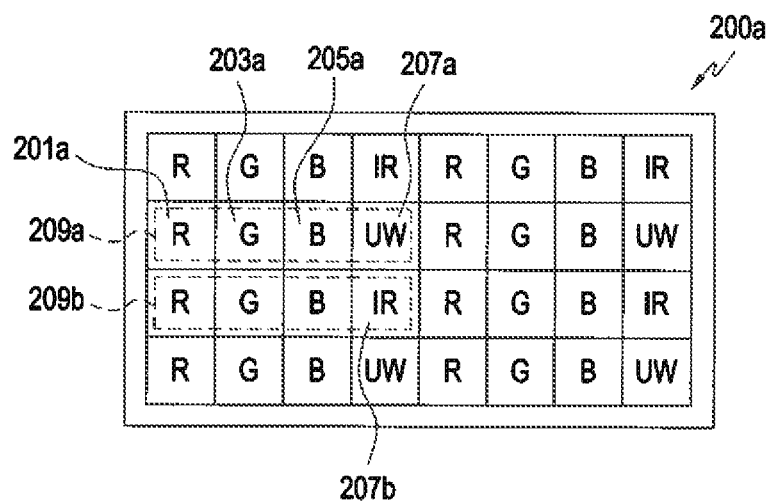
FIG. 9 is a plan view illustrating multiple pixels and multiple fingerprint sensors disposed in a display according to another one of various embodiments of the disclosure.

FIG. 9 is a plan view illustrating multiple pixels and multiple fingerprint sensors disposed in a display according to another one of various embodiments of the disclosure.

Referring to FIG. 9, a display 200a according to various embodiments of the disclosure may include multiple pixels 201a, 203a, and 205a and multiple fingerprint sensors 207a and 207b. A detailed description of components that are the same as or similar to those of the preceding embodiments will be omitted.

According to an embodiment of the disclosure, the multiple pixels 201a, 203a, and 205a may include first pixels 201a that output a red color, second pixels 203a that output a green color, and third pixels 205a that output a blue color. The first, second, and third pixels 201a, 203a, and 205a may have a rectangular shape. According to an embodiment of the disclosure, the first, second, and third pixels 201a, 203a, and 205a may be formed in various shapes, such as a circular shape or a polygonal shape without being limited to being formed in a rectangular shape.

According to an embodiment of the disclosure, the first pixels 201a may be arranged side by side along a column, the second pixels 203a may be arranged side by side along a column, and the third pixels 205a may be arranged side by side in columns. The first, second, and third pixels 201a, 203a, and 205a may be sequentially arranged in rows.

According to an embodiment of the disclosure, the multiple fingerprint sensors 207a and 207b may be disposed between the multiple pixels 201a, 203a, and 205a. The multiple fingerprint sensors 207a and 207b may include first fingerprint sensors 207a and second fingerprint sensors 207b. The first and second fingerprint sensors 207a and 207b may be sequentially disposed in rows. A first pixel 201a, a second pixel 203a, a third pixel 205a, and a first fingerprint sensor 207a may form one first pattern 209a. The first pattern 209a may be repeatedly formed in the display 200a in a row. A first pixel 201a, a second pixel 203a, a third pixel 205a, and a second fingerprint sensor 207b may form one second pattern 209b. The second pattern 209b may be repeatedly formed in the display 200a in rows. The first and second patterns 209a and 209b may be sequentially formed on the display 200a in columns.

Figure 10:
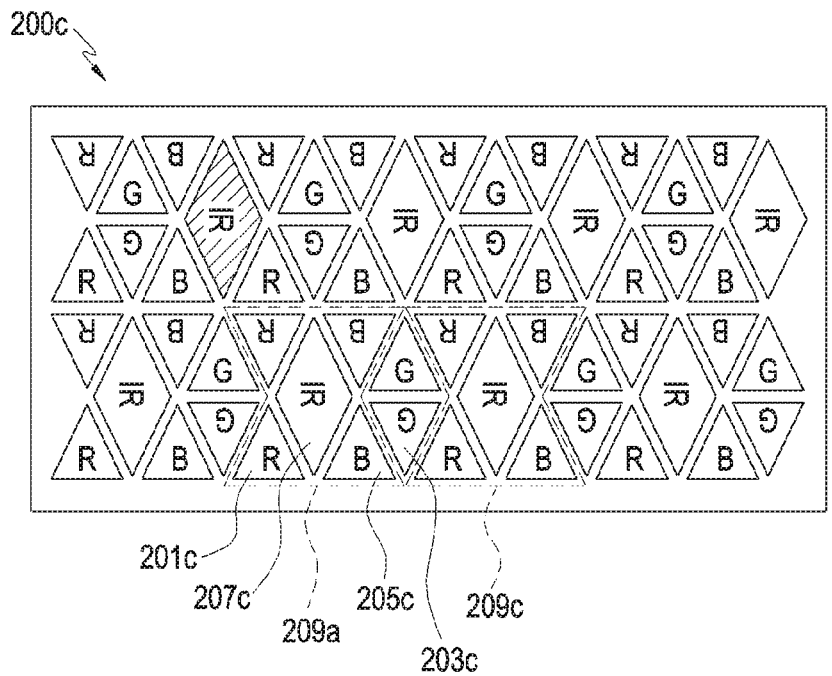
FIG. 10 is a plan view illustrating multiple pixels and multiple fingerprint sensors disposed in a display according to still another one of various embodiments of the disclosure.

FIG. 10 is a plan view illustrating multiple pixels and multiple fingerprint sensors disposed in a display according to still another one of various embodiments of the disclosure.

Referring to FIG. 10, a display 200c according to various embodiments of the disclosure may include multiple pixels 201c, 203c, and 205c and multiple fingerprint sensors 207c. A detailed description of components that are the same as or similar to those of the preceding embodiments will be omitted.

According to an embodiment of the disclosure, the multiple pixels 201c, 203c, and 205c may include first pixels 201c that output a red color, second pixels 203c that output a green color, and third pixels 205c that output a blue color. The first, second, and third pixels 201a, 203a, and 205a may have a triangular shape.

According to an embodiment of the disclosure, the multiple fingerprint sensors 207c may be disposed between the second and third pixels 203c and 205c. According to an embodiment of the disclosure, the multiple fingerprint sensors 207c may be formed in a diamond shape. For example, the size of the diamond-shaped fingerprint sensors 207c may be approximately twice the size of the triangular first, second, and third pixels 201c, 203c, and 205c. Each of the multiple fingerprint sensors 207c may be surrounded by the second and third pixels 203c and 205c. A second pixel 203c, a third pixel 205c, and a fingerprint sensor 207c may form one pattern 209c. A first pixel 201c may be disposed between the patterns 209c. The pattern 209c may be repeatedly formed in the display 200a in a row.

According to an embodiment of the disclosure, the pattern 209c is not limited to being formed of a fingerprint sensor 207c and second and third pixels 203c and 205c, and may be formed of a fingerprint sensor 207c and first and second pixels 201c and 203c or may be formed of a fingerprint sensor 207c and first and third pixels 201c and 205c. According to an embodiment of the disclosure, each fingerprint sensor 207c may be surrounded by first, second, and third pixels 201c, 203c and 205c, so that each pattern 209c may be formed of a fingerprint sensor 207c and first, second, and third pixels 201c, 203c, and 205c.

Figure 11:
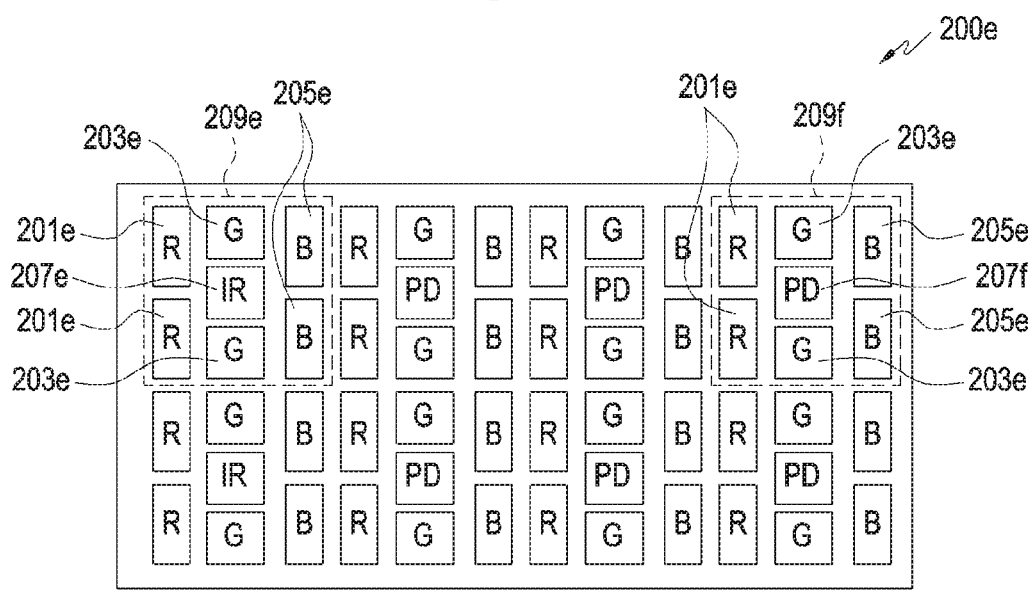
FIG. 11 is a plan view illustrating multiple pixels and multiple fingerprint sensors disposed in a display according to still another one of various embodiments of the disclosure.

FIG. 11 is a plan view illustrating multiple pixels and multiple fingerprint sensors disposed in a display according to still another one of various embodiments of the disclosure.

Referring to FIG. 11, a display 200e according to various embodiments of the disclosure may include multiple pixels 201e, 203e, and 205e and multiple fingerprint sensors 207e and 207f. A detailed description of components that are the same as or similar to those of the preceding embodiments will be omitted.

According to an embodiment of the disclosure, the multiple pixels 201e, 203e, and 205e may include first pixels 201e that output a red color, second pixels 203e that output a green color, and third pixels 205e that output a blue color. The first, second, and third pixels 2013e, 203e, and 205e may have a rectangular shape. The first and third pixels 201e and 205e may have a smaller width and a longer length than the second pixels 203e. The first and third pixels 201e and 205e may be arranged in rows.

According to an embodiment of the disclosure, the second and third pixels 203e and 205e may have a smaller width and a longer width than the first pixels 203e, and the first and second pixels 201e and 203e may have a smaller width and a longer length than the third pixel 205e.

According to an embodiment of the disclosure, the multiple fingerprint sensors 207e and 207f may be disposed between multiple pixels 201e, 203e, and 205e. The multiple fingerprint sensors 207a and 207f may include first fingerprint sensors 207e and second fingerprint sensors 207f. The first and second fingerprint sensors 207e and 207f may have the same size as the second pixel 203e. The multiple fingerprint sensors 207e and 207f and the second pixels 203e may be sequentially arranged in columns.

According to an embodiment of the disclosure, each first fingerprint sensor 207e may form a first pattern 209e with first, second, and third pixels 201e, 203e, and 205e, and each second fingerprint sensor 207f may form a second pattern 209f with first, second, and third pixels 201e, 203e, and 205e.

Figure 12:
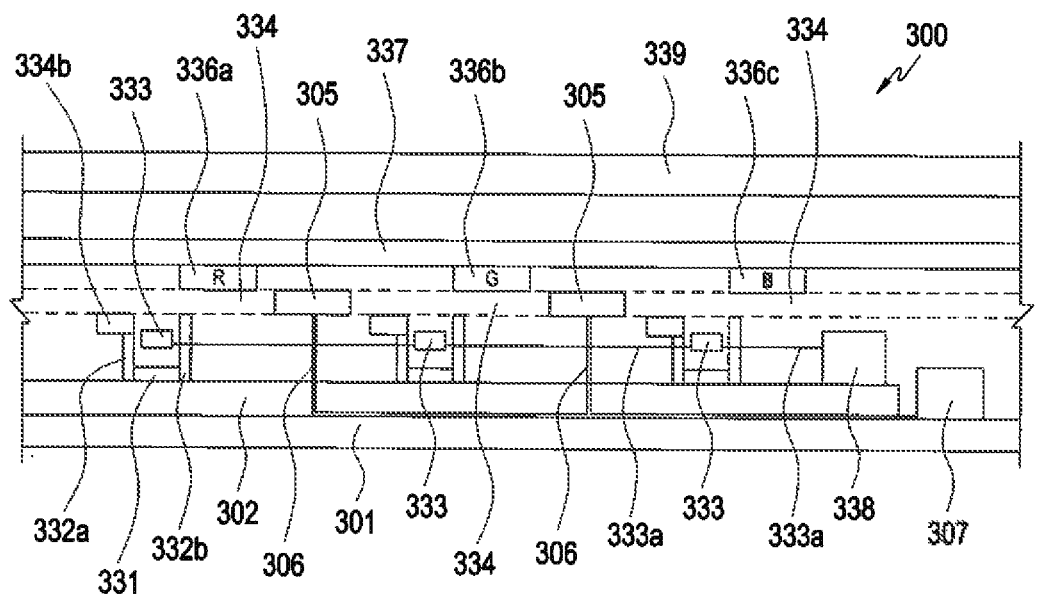
FIG. 12 is a cross-sectional view illustrating a display according to still another one of various embodiments of the disclosure.

FIG. 12 is a cross-sectional view illustrating a display according to still another one of various embodiments of the disclosure.

Referring to FIG. 12, a display 300 according to still another one of various embodiments of the disclosure may include a display panel and a plurality of fingerprint sensors 305. According to an embodiment of the disclosure, the display panel may be an OLED panel or an LCD panel. An embodiment of the disclosure will be described mainly with reference to an OLED panel. The display panel may include a transparent plate 339, films 301 and 302, an anode layer 334, a cathode layer 337, transistors 333 and 334b, multiple pixels 336a, 336b, and 336c, and a fingerprint sensor drive circuit 307.

According to an embodiment of the disclosure, the anode layer 334, the multiple pixels 336a, 336b, and 336c, and the cathode layer 337 may be sequentially laminated between the films 301 and 302 and the transparent plate 339.

According to an embodiment of the disclosure, the transparent plate 339 may be formed of various organic materials and/or inorganic materials. The transparent plate 339 may be formed, for example, in a form in which multiple layers (e.g., five layers or more) of organic materials and inorganic materials are repeatedly laminated. According to various embodiments of the disclosure, the transparent plate 339 may be formed of a single inorganic layer.

According to an embodiment of the disclosure, the films 301 and 302 may include any one material or a combination of two or more materials selected from a group consisting of acrylonitrile butadiene styrene (ABS), acrylic, polycarbonate (PC), polymethyl methacrylate (PMMA), polyimide (PI), polyethylene terephthalate (PET), polypropylene terephthalate (PPT), amorphous polyethylene terephthalate (APET), polyethylene naphthalate terephthalate (PEN), polyethylene terephthalate glycol (PETG), tri-acetyl-cellulose (TAC), cyclic olefin polymer (COP), cyclic olefin copolymer (COC), polydicyclopentadiene (PDCPD), cyclopentadiene anions (CPD), polyarylate (PAR), polyethersulfone (PES), polyether imide (PEI), a modified epoxy resin, and an acrylic resin. The films 301 and 302 may include a first film 301 and a second film 302, and the first and second films 301 and 302 may be made of the same material or different materials.

According to an embodiment of the disclosure, the cathode layer 337 may include a transparent or opaque conductive material. For example, the cathode layer 337 is made of a transparent conductive material, and may include at least one of Indium-Tin-Oxide (ITO), Indium-Zinc-Oxide (IZO), PEDOT, an Ag nanowire, a transparent polymer conductor, or graphene. The cathode layer 337 may be an opaque conductive material, and may include at least one of silver (Ag), copper (Cu), magnesium (Mg), titanium (Ti), molybdenum (Mo), aluminum (Al), or graphene. The cathode layer 337 may be electrically connected to the transistors 331 through a conductive line 332b. When the transistors 331 transmit an electric signal to the cathode layer 337, the cathode layer 337 may be able to generate electrons.

According to an embodiment of the disclosure, the anode layer 334 may include a transparent or opaque conductive material. For example, the anode layer 334 may include at least one of Indium-Tin-Oxide (ITO), Indium-Zinc-Oxide (IZO), PEDOT, an Ag nanowire, a transparent polymer conductor, or graphene. The anode layer 334 may be an opaque conductive material, and may include at least one of silver (Ag), copper (Cu), magnesium (Mg), titanium (Ti), molybdenum (Mo), aluminum (Al), or graphene. The anode layer 334 may be electrically connected to the transistors 331 through a conductive line 332a. When the transistors 331 transmit an electric signal to the anode layer 334, the anode layer 334 may be able to generate holes.

According to an embodiment of the disclosure, the multiple pixels 336a, 336b, and 336c may be disposed on the same plane to form a light-emitting layer. The multiple pixels 336a, 336b, and 336c may output light using the holes supplied from the anode layer 334 and the electrons supplied from the cathode layer 337.

According to an embodiment of the disclosure, the transistors 333 and 334b may include a gate electrode 333, a source electrode 334b, and a drain electrode. The transistors 333 and 334b may be fabricated through a Low-Temperature Poly Silicon (LTPS) Thin Film Transistor (TFT) process. For example, the transistors 333 and 334b may be manufactured through the steps of depositing a barrier layer and an active layer on the films 301 and 302, forming a pattern through a gate insulating film and a gate electrode 333, and forming a pattern of an intermediate insulating film, source electrodes 334b, and drain electrodes after ion activation according to PMOS ion implantation. Thereafter, a protective film may be deposited and a pattern of pixel electrodes may be formed. In various embodiments of the disclosure, each of the layers constituting a laminated structure such as a barrier layer, a gate insulating film, an intermediate insulating film, and a protective film is referred to as a TFT layer.

According to an embodiment of the disclosure, the TFT layer may be formed through an LTPS TFT process on the films 301 and 302, and may include a semiconductor 303. The TFT layer may be further improved in the response speed and stability through the low-temperature polysilicon TFT process than through the existing a-Si TFT process.

According to an embodiment of the disclosure, a display 300 according to various embodiments of the disclosure may include a display drive circuit 338 (DDI) set to control the multiple pixels 336a, 336b, and 336c so as to provide display information. The display drive circuit 338 may be electrically connected to the gate electrodes 333 through a conductive line 333a.

According to an embodiment of the disclosure, each of the multiple fingerprint sensors 305 may be disposed between the multiple pixels 336a, 336b, and 336c, and the multiple fingerprint sensors 305 may be disposed on the same layer as the anode layer 334. The multiple fingerprint sensors 305 may include an electrode containing at least one of copper (Cu), titanium (Ti), molybdenum (Mo), and aluminum (Al). Since the multiple fingerprint sensors 305 are disposed on the anode layer 334 oriented in a direction opposite the direction in which the multiple pixels 336a, 336b, and 336c output light, the multiple fingerprint sensors 305 may be made of an opaque material as long as the material has good conductivity.

According to an embodiment of the disclosure, the fingerprint sensor drive circuit 307 may be disposed on the upper surface of the film 301. The fingerprint sensor drive circuit 307 may be electrically connected to the fingerprint sensors 305 through second wiring lines 306. The second wiring lines 306 may connect the fingerprint sensors 305 and the fingerprint sensor drive circuit 307 through the TFT layer. For example, the TFT layer may have holes in which the second wires 306 are disposed. According to an embodiment of the disclosure, the second wiring lines 306 may extend to the films 301 and 302 while being connected to the lower face of the fingerprint sensor 305. The film 302 may include a wiring layer formed between the first film 301 and the second film 302. The second wiring lines 306 may be disposed along the wiring layer via interlayer wiring lines formed in the first film 301, and may be connected to the fingerprint sensor drive circuit 307.

According to an embodiment of the disclosure, the fingerprint sensor drive circuit 307 may receive an electrical signal from the fingerprint sensors 305, and may transmit the fingerprint information to the processor 120 (FIG. 1). The processor 120 (FIG. 1) may perform a user security function using fingerprint information.

Figure 13:
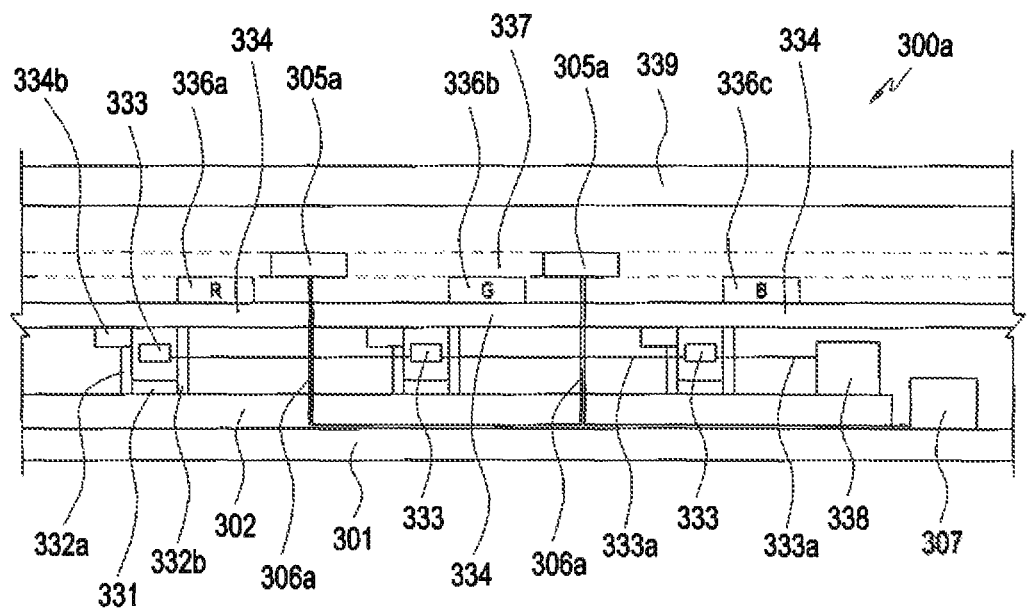
FIG. 13 is a cross-sectional view illustrating a display according to still another one of various embodiments of the disclosure.

FIG. 13 is a cross-sectional view illustrating a display according to still another one of various embodiments of the disclosure.

Referring to FIG. 13, a display 300a according to still another one of various embodiments of the disclosure may include a display panel including multiple pixels 336a, 336b, and 336c, and multiple fingerprint sensors 305a. A detailed description of components that are the same as or similar to those of the preceding embodiments will be omitted.

According to an embodiment of the disclosure, the multiple fingerprint sensors 305a may be disposed on the same layer as the cathode layer 337. The multiple fingerprint sensors 305a may be composed of electrodes containing at least one of Indium-Tin-Oxide (ITO) or Indium-Zinc-Oxide (IZO). According to various embodiments of the disclosure, the fingerprint sensors 305a are not limited to Indium-Tin-Oxide (ITO) or Indium-Zinc-Oxide (IZO), but may be made of various materials having transparency and conductivity.

According to an embodiment of the disclosure, the fingerprint sensor drive circuit 307 may be electrically connected to the multiple fingerprint sensors 305a through the second wiring lines 306a. The second wiring lines 306a may be connected to the fingerprint sensor drive circuit 307 through the anode line 334 and the TFT layer. For example, holes where the second wiring lines 306a are disposed may be formed in the anode layer 334, and the holes in the TFT layer connected to the holes in the anode layer 334 may be formed in the TFT layer. According to an embodiment of the disclosure, the second wiring lines 306a may extend to the films 301 and 302 while being connected to the lower face of the fingerprint sensors 305a. The films 301 and 302 may include a wiring layer formed between the first film 301 and the second film 302. The second wiring lines 306a may be disposed along the wiring layer via interlayer wiring lines formed in the first film 301, and may be connected to the fingerprint sensor drive circuit 307.

Figure 14:
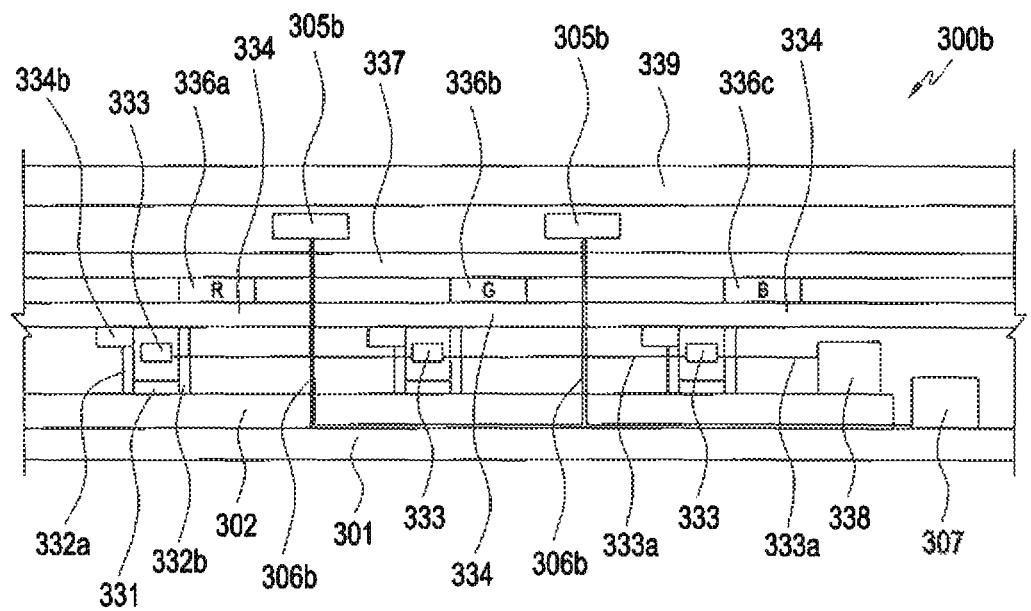
FIG. 14 is a cross-sectional view illustrating a display according to still another one of various embodiments of the disclosure.

FIG. 14 is a cross-sectional view illustrating a display according to still another one of various embodiments of the disclosure.

Referring to FIG. 14, a display 300b according to still another one of various embodiments of the disclosure may include a display panel including multiple pixels 336a, 336b, and 336c, and multiple fingerprint sensors 305a. A detailed description of components that are the same as or similar to those of the preceding embodiments will be omitted.

According to an embodiment of the disclosure, the multiple fingerprint sensors 305b may be disposed above the cathode layer 337. For example, the multiple fingerprint sensors 305b may be disposed between the transparent plate 339 and the cathode layer 337. The multiple fingerprint sensors 305b may be composed of electrodes containing at least one of Indium-Zinc-Oxide (ITO), Indium-Zinc-Oxide (IZO), an Ag nanowire, or a mesh-type metal. The mesh-type metal may be a conductive metal such as silver (Ag) or copper (Cu).

According to an embodiment of the disclosure, the fingerprint sensor drive circuit 307 may be electrically connected to the multiple fingerprint sensors 305b through second wiring lines 306b. The second wiring lines 306b may sequentially pass through the cathode layer 337, the anode layer 334, and the TFT layer and may be connected to the fingerprint sensor drive circuit 307. According to an embodiment of the disclosure, the second wiring lines 306b may extend to the films 301 and 302 while being connected to the lower face of the fingerprint sensor 305b. The films 301 and 302 may include a wiring layer formed between the first film 301 and the second film 302. The second wiring lines 306b may be disposed along the wiring layer via interlayer wiring lines formed in the first film 301, and may be connected to the fingerprint sensor drive circuit 307.

Figure 15:
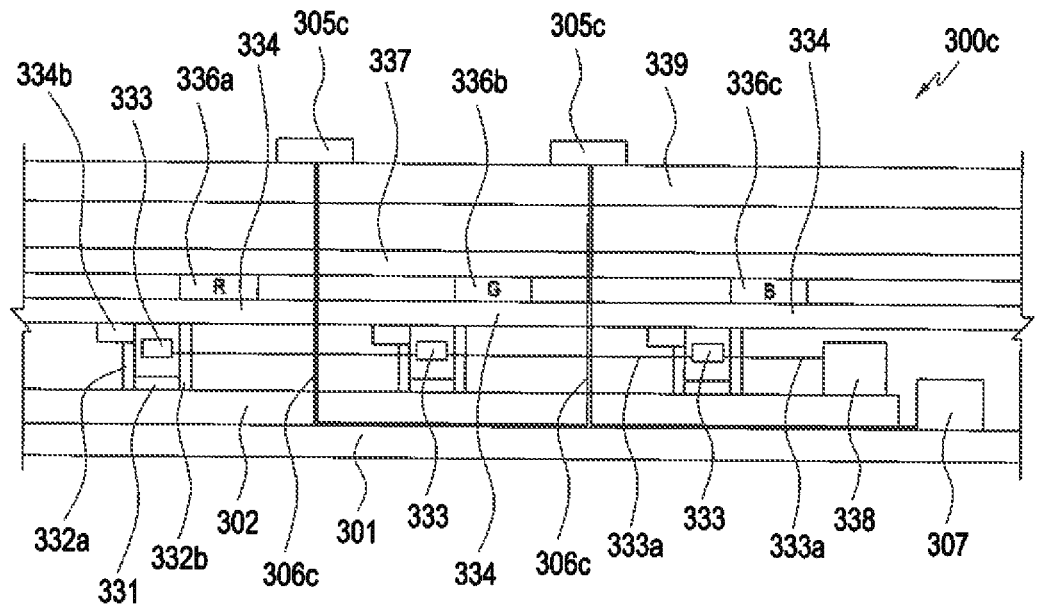
FIG. 15 is a cross-sectional view illustrating a display according to still another one of various embodiments of the disclosure.

FIG. 15 is a cross-sectional view illustrating a display according to still another one of various embodiments of the disclosure.

Referring to FIG. 15, a display 300c according to still another one of various embodiments of the disclosure may include a display panel including multiple pixels 336a, 336b, and 336c, and multiple fingerprint sensors 305c. A detailed description of components that are the same as or similar to those of the preceding embodiments will be omitted.

According to an embodiment of the disclosure, the multiple fingerprint sensors 305c may be disposed on the transparent plate 339. The multiple fingerprint sensors 305c may be composed of electrodes containing at least one of Indium-Zinc-Oxide (ITO), Indium-Zinc-Oxide (IZO), an Ag nanowire, or a mesh-type metal. The mesh-type metal may be a conductive metal such as silver (Ag) or copper (Cu).

According to an embodiment of the disclosure, the fingerprint sensor drive circuit 307 may be electrically connected to the multiple fingerprint sensors 305c through second wiring lines 306c. The second wiring lines 306c may sequentially pass through the transparent plate 339, the cathode layer 337, the anode layer 334, and the TFT layer and may be connected to the fingerprint sensor drive circuit 307. According to an embodiment of the disclosure, the second wiring lines 306c may extend to the films 301 and 302 while being connected to the lower face of the fingerprint sensor 305c. The films 301 and 302 may include a wiring layer formed between the first film 301 and the second film 302. The second wiring lines 306c may be disposed along the wiring layer via interlayer wiring lines formed in the first film 301, and may be connected to the fingerprint sensor drive circuit 307.

Figure 16:
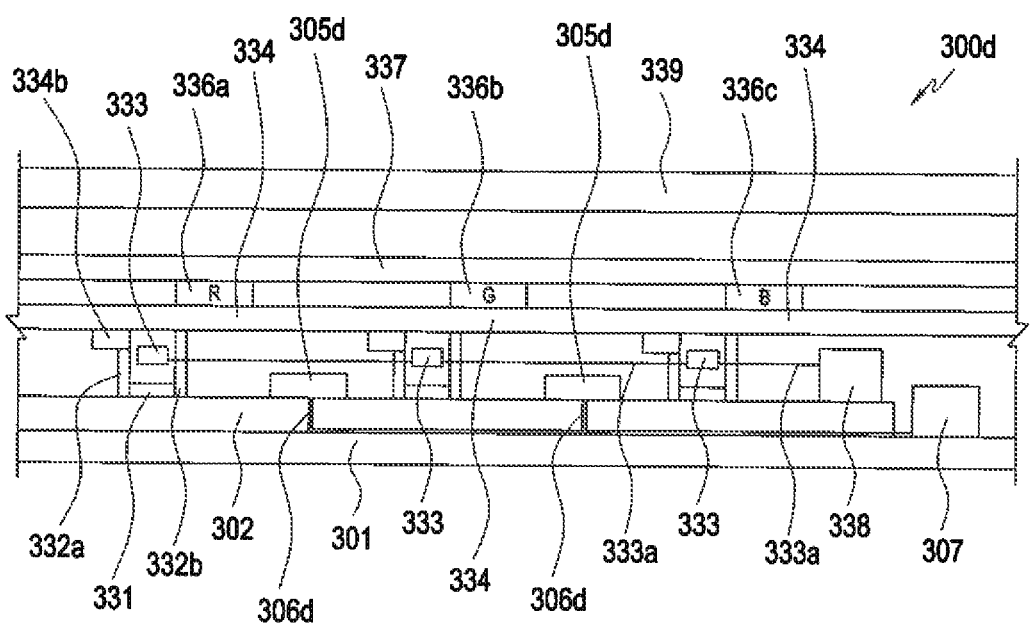
FIG. 16 is a cross-sectional view illustrating a display according to still another one of various embodiments of the disclosure.

FIG. 16 is a cross-sectional view illustrating a display according to still another one of various embodiments of the disclosure.

Referring to FIG. 16, a display 300d according to still another one of various embodiments of the disclosure may include a display panel including multiple pixels 336a, 336b, and 336c, and multiple fingerprint sensors 305d. A detailed description of components that are the same as or similar to those of the preceding embodiments will be omitted.

According to an embodiment of the disclosure, the multiple fingerprint sensors 305d may be disposed on the film 302. The multiple fingerprint sensors 305d may be composed of electrodes containing at least one of Indium-Zinc-Oxide (ITO), Indium-Zinc-Oxide (IZO), an Ag nanowire, or a mesh-type metal. The mesh-type metal may be a conductive metal such as silver (Ag) or copper (Cu).

According to an embodiment of the disclosure, the fingerprint sensor drive circuit 307 may be electrically connected to the multiple fingerprint sensors 305d through second wiring lines 306d. According to an embodiment of the disclosure, the second wiring lines 306d may extend to the films 301 and 302 while being connected to the lower face of the fingerprint sensor 305d. The films 301 and 302 may include a wiring layer formed between the first film 301 and the second film 302. The second wiring lines 306d may be disposed along the wiring layer via interlayer wiring lines formed in the first film 301, and may be connected to the fingerprint sensor drive circuit 307.

Figure 17:
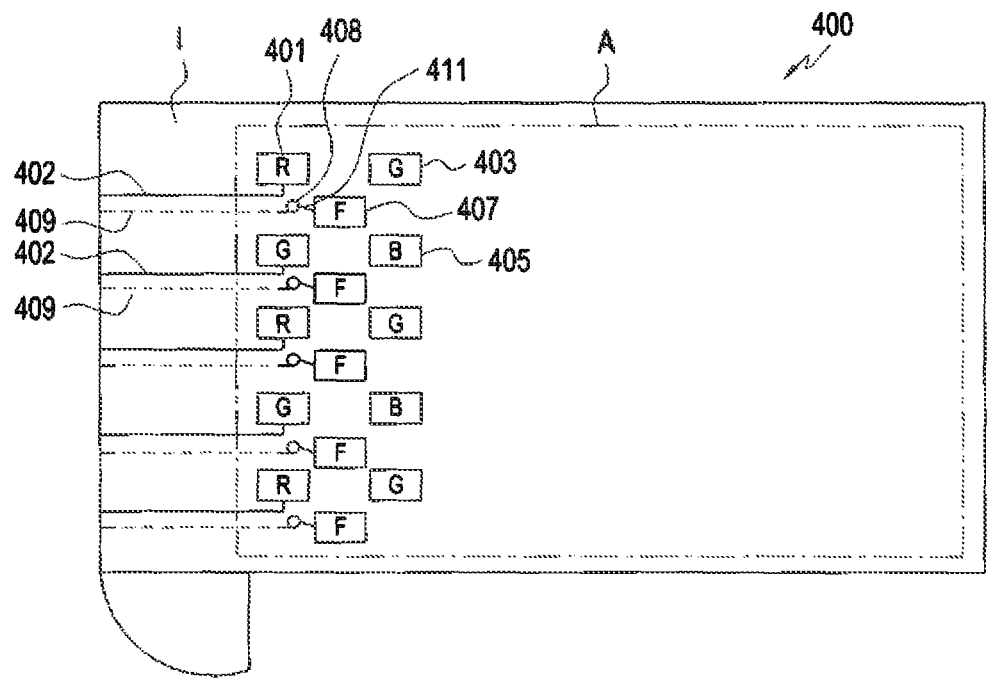
FIG. 17 is a plan view illustrating a display according to still another one of various embodiments of the disclosure.

FIG. 17 is a plan view illustrating a display according to still another one of various embodiments of the disclosure.

Referring to FIG. 17, a display 400 according to still another one of various embodiments of the disclosure may include an active area A, in which a screen is implemented, and an inactive area I, in which conductive lines connecting multiple pixels 401, 403, and 405 are arranged.

According to an embodiment of the disclosure, multiple pixels 401, 403, and 405 and multiple fingerprint sensors 407 may be arranged in the active area A. For example, multiple fingerprint sensors 407 may be arranged between the multiple pixels 401, 403, and 405. For example, the pixels 401, 403, and 405 may be sequentially arranged in rows and columns, and the fingerprint sensors 407 may be sequentially arranged in rows and columns. The rows and columns along which the pixels 401, 403, and 405 are arranged may not overlap the rows and columns along which the fingerprint sensors 407 are arranged. According to an embodiment of the disclosure, the arrangement of the multiple fingerprint sensors 407 is not limited to being sequentially arranged in rows and columns. The multiple fingerprint sensors 407 may be arranged in a non-sequential manner.

According to an embodiment of the disclosure, the multiple fingerprint sensors 407 may be disposed on a layer different from the layer on which the multiple pixels 401, 403, and 405 are disposed.

According to an embodiment of the disclosure, the pixels 401, 403, and 405 may be electrically connected to the conductive lines of the inactive area I through the first wiring lines 402.

According to an embodiment of the disclosure, the display 400 may include interlayer wiring lines 408 disposed in the active area A. The interlayer wiring lines 408 may include a conductive material. The fingerprint sensors 407 may be electrically connected to the interlayer wiring lines 408 through connection lines 411. The interlayer wiring lines 408 may be electrically connected to the conductive lines of the inactive area I through the second wiring lines 409, and thus the fingerprint sensors 407 may be electrically connected to the conductive lines of the inactive area I.

Figure 18:
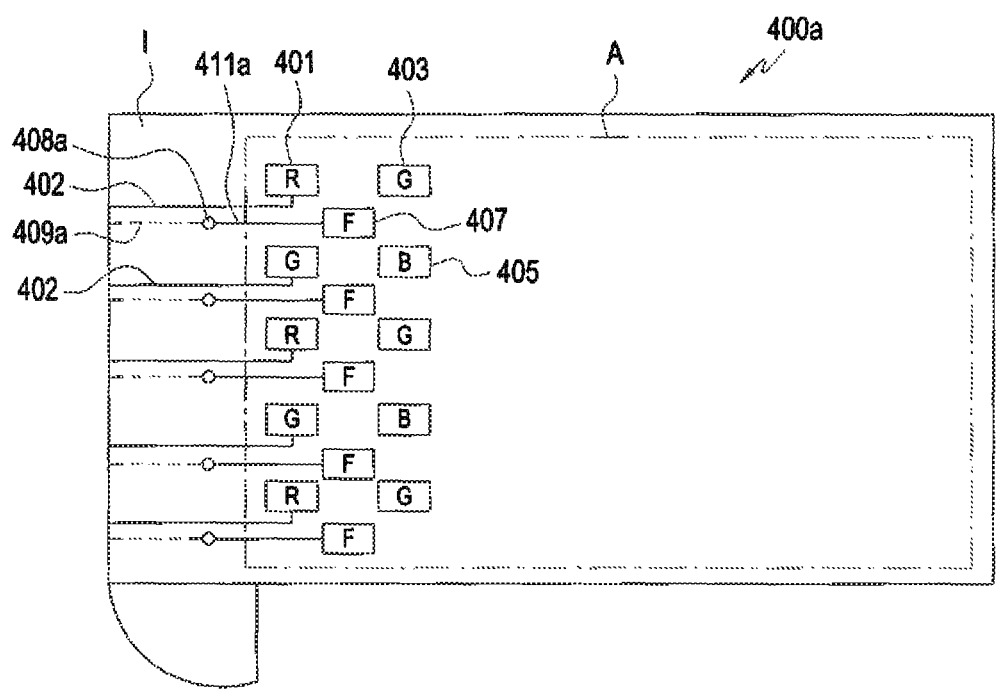
FIG. 18 is a plan view illustrating a display according to still another one of various embodiments of the disclosure.

FIG. 18 is a plan view illustrating a display according to still another one of various embodiments of the disclosure.

Referring to FIG. 18, a display 400a according to still another one of various embodiments of the disclosure has components which are the same as or similar to the components of the display 400 illustrated in FIG. 13. A description will be made focusing on the positions of interlayer wiring lines 408a.

According to an embodiment of the disclosure, the interlayer wiring lines 408a may be formed in the inactive area I. The fingerprint sensors 407 may be electrically connected to the interlayer wiring lines 408 through connection lines 411a. The interlayer wiring lines 408a may be electrically connected to the conductive lines of the inactive area I through the second wiring lines 409a, and thus the fingerprint sensors 407 may be electrically connected to the conductive lines of the inactive area I.

Figure 19:
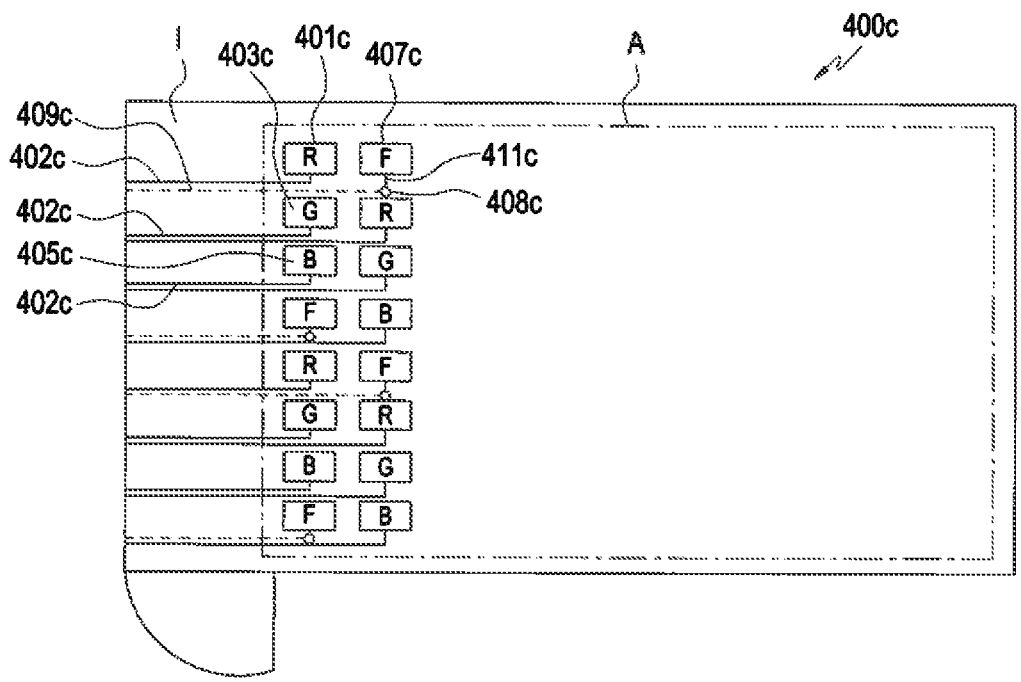
FIG. 19 is a plan view illustrating a display according to still another one of various embodiments of the disclosure.

FIG. 19 is a plan view illustrating a display according to still another one of various embodiments of the disclosure.

Referring to FIG. 19, a display 400c according to still another one of various embodiments of the disclosure may include multiple pixels 401c, 403c, and 405c and multiple fingerprint sensors 407c, which are arranged in the active area A. A detailed description of components that are the same as or similar to those of the display 400 illustrated in FIG. 13 will be omitted.

According to an embodiment of the disclosure, the multiple pixels 401c, 403c, and 405c may be disposed in rows and columns.

According to an embodiment of the disclosure, the fingerprint sensors 407c may be arranged between the multiple pixels 401c, 403c, and 405c, and may be arranged in rows and columns formed by arranging the multiple pixels 401c, 403c, and 405c.

According to an embodiment of the disclosure, the pixels 401c, 403c, and 405c may be electrically connected to the conductive lines of the inactive area I through the first wiring lines 402c.

According to an embodiment of the disclosure, the display 400c may include interlayer wiring lines 408c disposed in the active area A. The interlayer wiring lines 408c may include a conductive material. The fingerprint sensors 407c may be electrically connected to the interlayer wiring lines 408c through connection lines 411c. The interlayer wiring lines 408c may be electrically connected to the conductive lines of the inactive area I through the second wiring lines 409c, and thus the fingerprint sensors 407c may be electrically connected to the conductive lines of the inactive area I.

Figure 20:
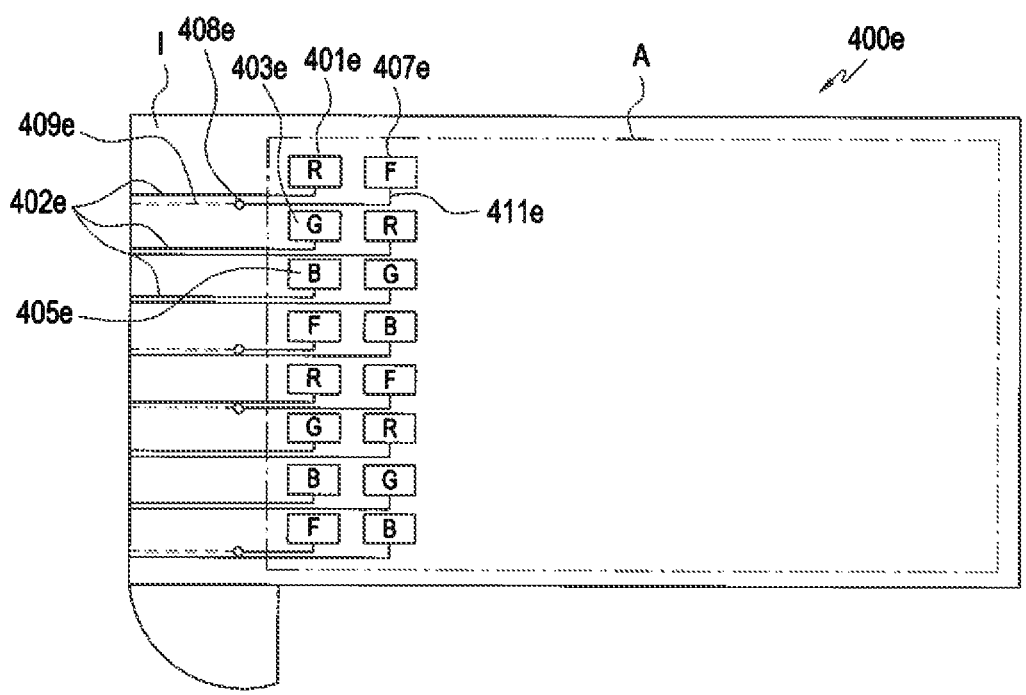
FIG. 20 is a plan view illustrating a display according to still another one of various embodiments of the disclosure.

FIG. 20 is a plan view illustrating a display according to still another one of various embodiments of the disclosure.

Referring to FIG. 20, a display 400e according to still another one of various embodiments of the disclosure may include multiple pixels 401e, 403e, and 405e and multiple fingerprint sensors 407e, which are arranged in the active area A. A detailed description of components that are the same as or similar to those of the display 400c illustrated in FIG. 19 will be omitted, and a description will be made focusing on the positions of the interlayer wiring lines 408e.

According to an embodiment of the disclosure, the pixels 401e, 403e, and 405e may be electrically connected to the conductive lines of the inactive area I through the first wiring lines 402e.

According to an embodiment of the disclosure, the interlayer wiring lines 408e may be formed in the inactive area I. The fingerprint sensors 407e may be electrically connected to the interlayer wiring lines 408e through connection lines 411e. The interlayer wiring lines 408e may be electrically connected to the conductive lines of the inactive area I through the second wiring lines 409e, and thus the fingerprint sensors 407e may be electrically connected to the conductive lines of the inactive area I.

Figure 21:
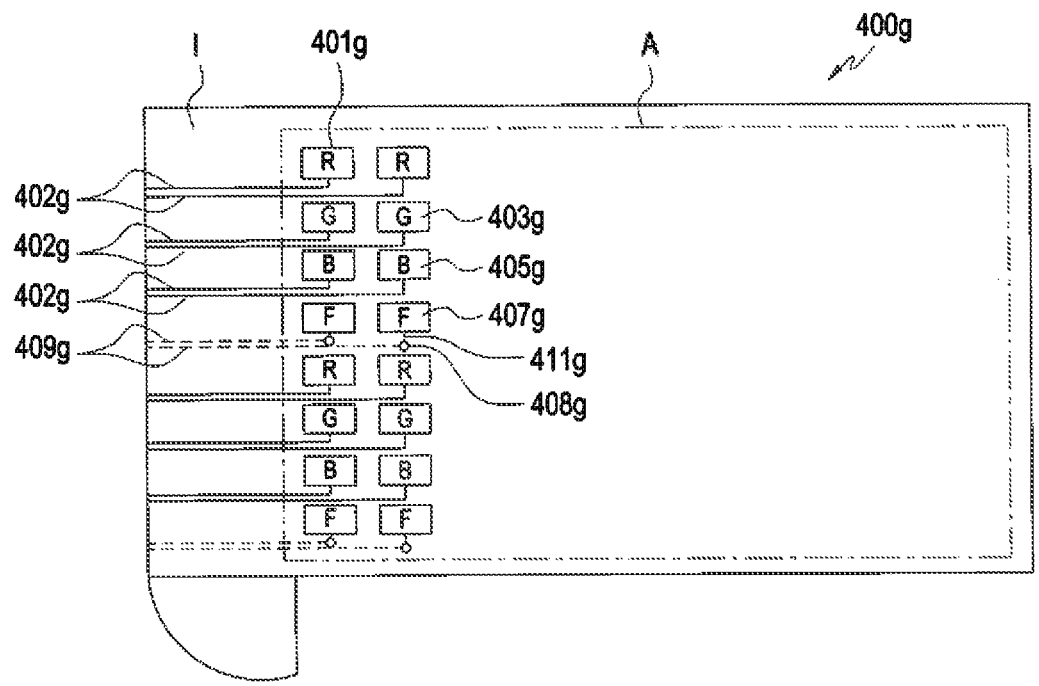
FIG. 21 is a plan view illustrating a display according to still another one of various embodiments of the disclosure.

FIG. 21 is a plan view illustrating a display according to still another one of various embodiments of the disclosure.

Referring to FIG. 21, a display 400g according to still another one of various embodiments of the disclosure may include multiple pixels 401g, 403g, and 405g and multiple fingerprint sensors 407g, which are arranged in the active area A. A detailed description of components that are the same as or similar to those of the display 400c illustrated in FIG. 19 will be omitted.

According to an embodiment of the disclosure, the multiple pixels 401g, 403g, and 405g may include first pixels 401g that output a red color, second pixels 403g that output a green color, and third pixels 405g that output a blue color. The first, second, and third pixels 401g, 403g, and 405g may be sequentially arranged in rows and columns.

According to an embodiment of the disclosure, the multiple fingerprint sensors 407g may be disposed between multiple pixels 401g, 403g, and 405g. The fingerprint sensors 407g may be arranged in rows and columns together with the first, second, and third pixels 401g, 403g, and 405g.

According to an embodiment of the disclosure, the pixels 401g, 403g, and 405g may be electrically connected to the conductive lines of the inactive area I through the first wiring lines 402g.

According to an embodiment of the disclosure, the display 400g may include interlayer wiring lines 408g disposed in the active area A. The interlayer wiring lines 408g may include a conductive material. The fingerprint sensors 407g may be electrically connected to the interlayer wiring lines 408g through connection lines 411g. The interlayer wiring lines 408g may be electrically connected to the conductive lines of the inactive area I through the second wiring lines 409g, and thus the fingerprint sensors 407g may be electrically connected to the conductive lines of the inactive area I.

Figure 22:
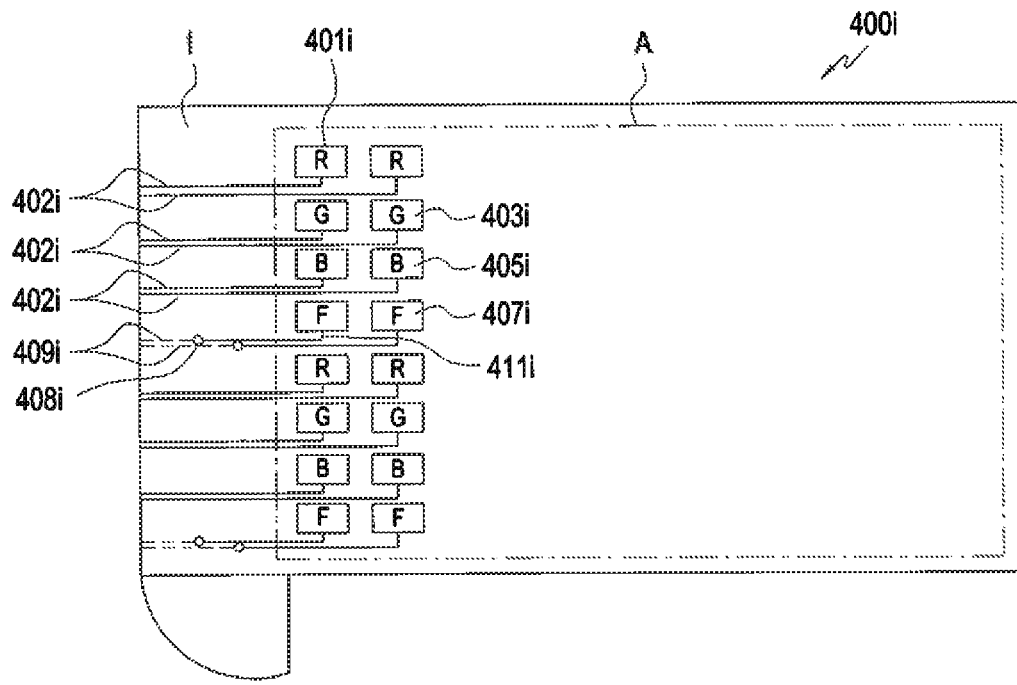
FIG. 22 is a plan view illustrating a display according to still another one of various embodiments of the disclosure.

FIG. 22 is a plan view illustrating a display according to still another one of various embodiments of the disclosure.

Referring to FIG. 22, a display 400i according to still another one of various embodiments of the disclosure may include multiple pixels 401i, 403i, and 405i and multiple fingerprint sensors 407i, which are arranged in the active area A. A detailed description of components that are the same as or similar to those of the display 400g illustrated in FIG. 21 will be omitted, and a description will be made focusing on the positions of the interlayer wiring lines 408i.

According to an embodiment of the disclosure, the pixels 401i, 403i, and 405i may be electrically connected to the conductive lines of the inactive area I through the first wiring lines 402i.

According to an embodiment of the disclosure, the interlayer wiring lines 408i may be formed in the inactive area I. The fingerprint sensors 407i may be electrically connected to the interlayer wiring lines 408i through connection lines 411i. The interlayer wiring lines 408i may be electrically connected to the conductive lines of the inactive area I through the second wiring lines 409i, and thus the fingerprint sensors 407i may be electrically connected to the conductive lines of the inactive area I.

Figure 23:
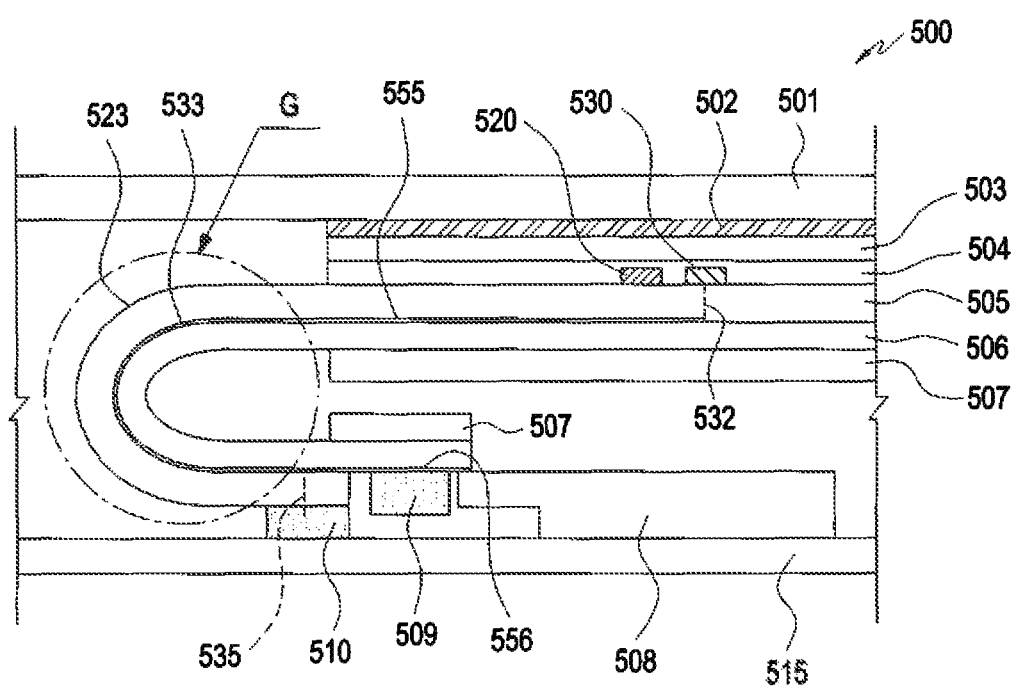
FIG. 23 is a cross-sectional view illustrating an electronic device including a display according to still another one of various embodiments of the disclosure.

FIG. 23 is a cross-sectional view illustrating an electronic device including a display according to still another one of various embodiments of the disclosure.

Referring to FIG. 23, an electronic device including a display 500 according to still another one of various embodiments of the disclosure may include a front cover 501, a touch panel 502, a polarizing layer 503, a display panel 504, one or more pixels 520, one or more fingerprint sensors 530, films 505 and 506, a circuit board 508, and a rear cover 515.

According to an embodiment of the disclosure, the front cover 501 may be the transparent cover 103 illustrated in FIG. 6, and may form at least a portion of the first face 101 (FIG. 6) of the electronic device 10. The rear cover 515 may form at least a portion of the second face 102 illustrated in FIG. 6.

According to an embodiment of the disclosure, the touch panel 502 may be attached to the lower face of the front cover 501. According to various embodiments of the disclosure, when the fingerprint sensors 530 perform the function of an input device, the touch panel 502 may be excluded from the configuration of the electronic device 500.

According to an embodiment of the disclosure, the polarizing layer 503 may be attached to the lower face of the touch panel 502. According to an embodiment of the disclosure, the polarizing layer 503 may be attached to the upper face of the touch panel 502.

According to an embodiment of the disclosure, the display panel 504 may be attached to the lower face of the polarizing layer 503. The fingerprint sensors 530 may be mounted on the display panel 504. Pixels 520 may be arranged on the display 500, and the fingerprint sensors 530 may be arranged between the pixels.

According to an embodiment of the disclosure, the films 505 and 506 may be attached to the lower face of the display panel 504. The films 505 and 506 may include a first film 505 and a second film 506. A wiring layer 555 may be disposed between the first film 505 and the second film 506. The wiring layer 555 may include an extension area 556 extending to the outside of the display panel 504. The first and second films 505 and 506 may be bent. A protective film 507 may be attached to a second face of the second film 506. The protective film 507 may cover the second film 506 except for the bent area of the second film 506. According to various embodiments of the disclosure, the protective film 507 may completely cover the second side of the second film 506.

According to an embodiment of the disclosure, a circuit board 508 for driving the display 500, a display drive circuit 510, and a fingerprint sensor drive circuit 510 may be provided between the rear cover 515 and the films 505 and 506. At least a portion of the films 505 and 506 may be bent and connected to the circuit board 507. The display drive circuit 510 may be electrically connected to the pixels 520 through a first wiring line 523. The fingerprint sensor drive circuit 509 may be electrically connected to the fingerprint sensors 530 through a second wiring line 533. The fingerprint sensor drive circuit 509 may be disposed in the extension area 556 while being coupled with the second film 506. The display drive circuit 510 may be coupled to the first film 505 while being disposed to be spaced apart from the fingerprint sensor drive circuit 509.

According to an embodiment of the disclosure, the electronic device 500 may include the first wiring line 523 and the second wiring line 533. The first wiring line 523 may be disposed on the first face of the first film 505, and may electrically connect the pixels 520 to the display drive circuit 510. The second wiring line 533 may be disposed on the wiring layer formed between the first film 505 and the second film 506. The second wiring line 533 may electrically connect the fingerprint sensors 530 and the second fingerprint sensor drive circuit 509 via an interlayer wiring line 532 formed on the first film 505. According to an embodiment of the disclosure, the first wiring line 523 may not be formed on the wiring layer 555. According to an embodiment of the disclosure, the wiring layer 555 is not limited to being disposed between the first film 505 and the second film 506, and may be disposed on any one of multiple layers that form the display panel 504.

According to an embodiment of the disclosure, a second interlayer wiring line 535 for electrically connecting the first wiring line 523 and the second wiring line 533 may be formed on the first film 505. The display drive circuit 510 and the fingerprint sensor drive circuit 509 may be electrically connected via the second interlayer wiring line 535 between the first and second wiring lines 523 and 533.

Figure 24:
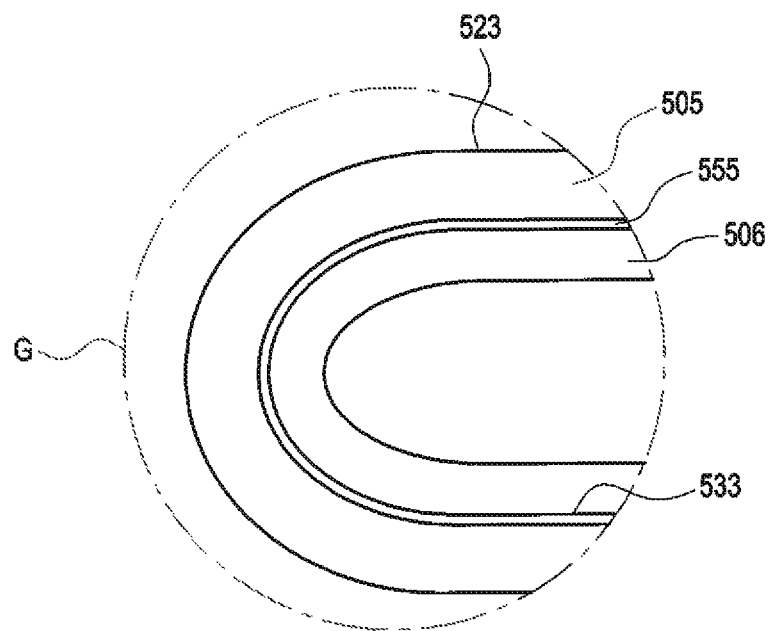
FIG. 24 is an enlarged view of a part G indicated in FIG. 23.

FIG. 24 is an enlarged view of part G indicated in FIG. 23.

Referring to FIG. 24, according to various embodiments of the disclosure, the film 523 may include an inorganic layer 555 between the first film 505 and the second film 506. The inorganic layer 555 may include silicon nitride (SiNx (x is a natural number)). According to various embodiments of the disclosure, the inorganic layer 555 is not limited to silicon nitride, but may be made of any of various transparent materials.

According to an embodiment of the disclosure, the second wiring line 533 may be disposed between the inorganic layer 555 and the second film 506.

Figure 25:
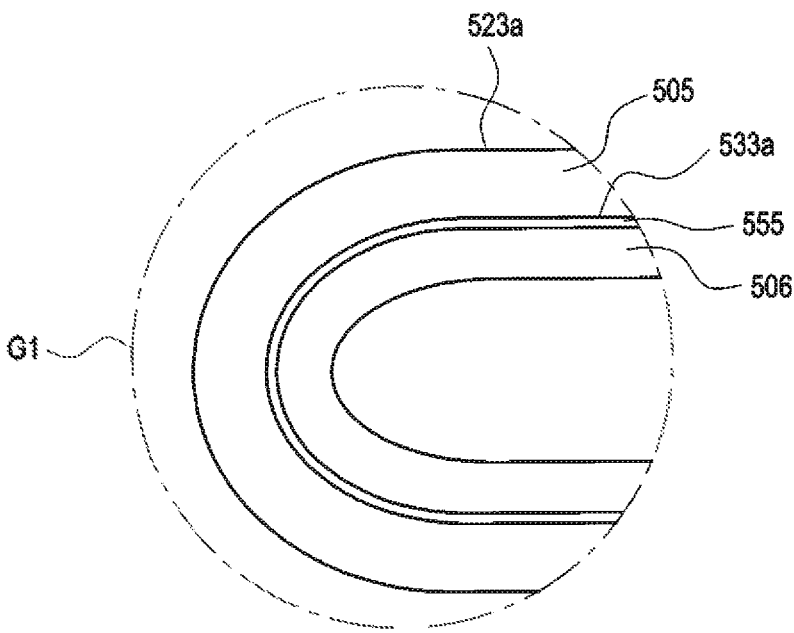
FIG. 25 is a view illustrating a modification of the part G illustrated in FIG. 23.

FIG. 25 is a view illustrating a modified example G1 of the part G indicated in FIG. 23.

Referring to FIG. 25, the first wiring line 523a may be disposed on the first face of the first film 505.

The second wiring line 533a according to an embodiment of the disclosure is not limited to being disposed between the inorganic layer 555 and the second film 506, and may be disposed between the inorganic layer 555 and the first film 505.

Figure 26:
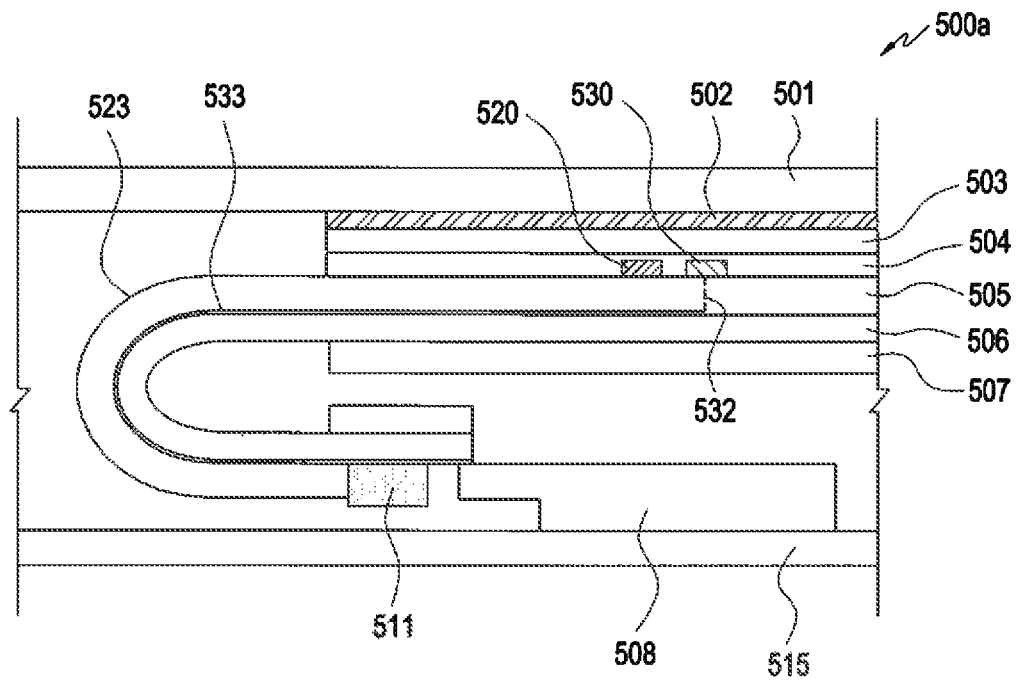
FIG. 26 is a cross-sectional view illustrating an electronic device including a display according to still another one of various embodiments of the disclosure.

FIG. 26 is a cross-sectional view illustrating an electronic device including a display according to still another one of various embodiments of the disclosure.

Referring to FIG. 26, an electronic device including a display 500a according to still another one of various embodiments of the disclosure may include a front cover 501, a touch panel 502, a polarizing layer 503, a display panel 504, pixels 520, one or more fingerprint sensors 530, films 505 and 506, a circuit board 508, and a rear cover 515. A description of components, which are the same as or similar to the components of the preceding embodiments, will be omitted.

According to an embodiment of the disclosure, the fingerprint sensor drive circuit 511 may also carry out the function of the display drive circuit. The fingerprint sensor drive circuit 511 may be coupled to the second face of the second film 506 while being coupled to a side face of the first film 505. The fingerprint sensor drive circuit 511 may be electrically connected to the pixels 520 via the first wiring line 523, and may be electrically connected to the fingerprint sensors 530 via the second wiring line 533.

Figure 27:
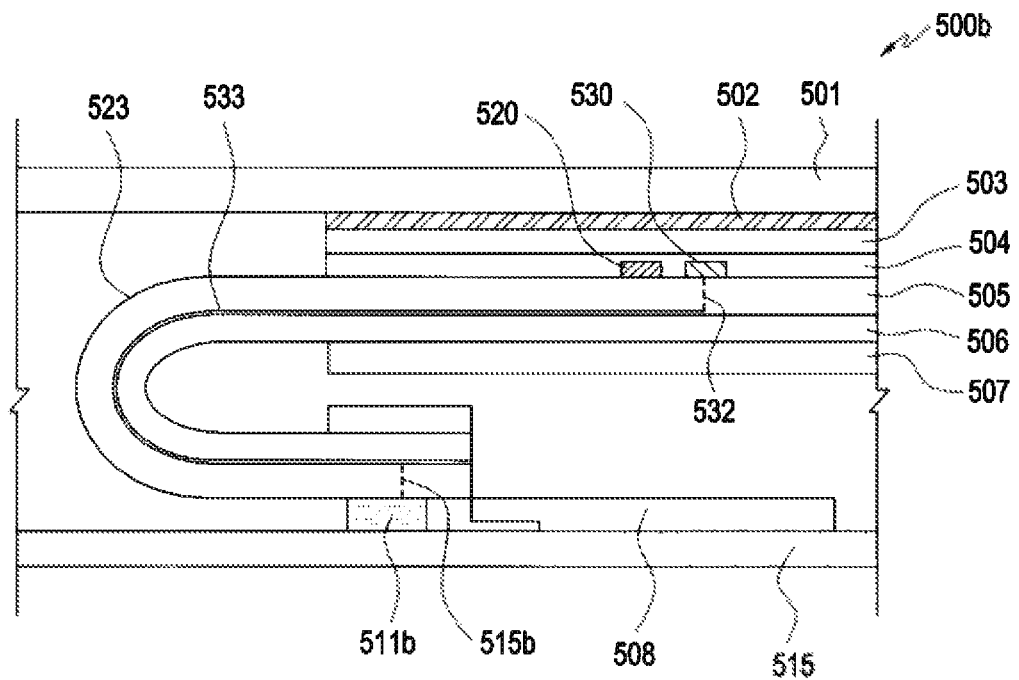
FIG. 27 is a cross-sectional view illustrating an electronic device including a display according to still another one of various embodiments of the disclosure.

FIG. 27 is a cross-sectional view illustrating an electronic device including a display according to still another one of various embodiments of the disclosure.

Referring to FIG. 27, an electronic device including a display 500b according to still another one of various embodiments of the disclosure may include a front cover 501, a touch panel 502, a polarizing layer 503, a display panel 504, pixels 520, one or more fingerprint sensors 530, films 505 and 506, a circuit board 508, and a rear cover 515. A description of components, which are the same as or similar to the components of the preceding embodiments, will be omitted.

According to an embodiment of the disclosure, the fingerprint sensor drive circuit 511b may also carry out the function of the display drive circuit.

According to an embodiment of the disclosure, the fingerprint sensor drive circuit 511b may be attached to the first face of the first film 505. The fingerprint sensor drive circuit 511b may be electrically connected to the pixels 520 via a first wiring line 523. A second interlayer wiring line 515b may be formed on the first film 505, and the second interlayer wiring line 515b may electrically connect the first wiring line 523 and the second wiring line 533. The fingerprint sensor drive circuit 511b may be electrically connected to the fingerprint sensors 530 sequentially through the interlayer wiring line 515b, the second wiring line 533, and the interlayer wiring line 532.

Figure 28:
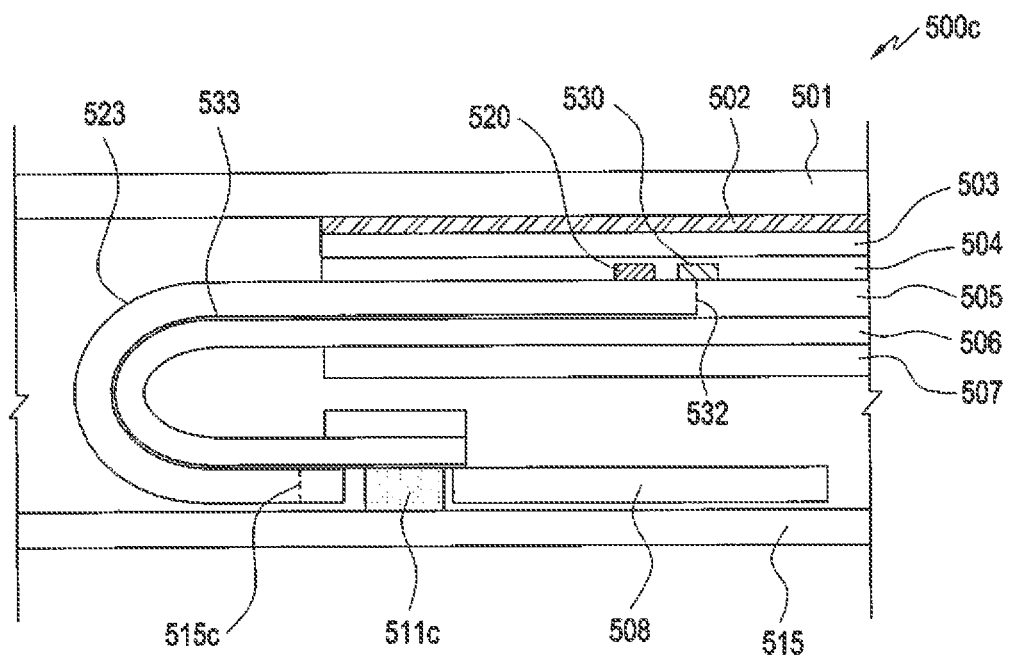
FIG. 28 is a cross-sectional view illustrating an electronic device including a display according to still another one of various embodiments of the disclosure.

FIG. 28 is a cross-sectional view illustrating an electronic device including a display according to still another one of various embodiments of the disclosure.

Referring to FIG. 28, an electronic device including a display 500c according to still another one of various embodiments of the disclosure may include a front cover 501, a touch panel 502, a polarizing layer 503, a display panel 504, pixels 520, one or more fingerprint sensors 530, films 505 and 506, a circuit board 508, and a rear cover 515. A description of components, which are the same as or similar to the components of the preceding embodiments, will be omitted.

According to an embodiment of the disclosure, the fingerprint sensor drive circuit 511c may also carry out the function of the display drive circuit.

According to an embodiment of the disclosure, the fingerprint sensor drive circuit 511c may be coupled to the first face of the second film 506 while being spaced apart from a side face of the first film 505. The fingerprint sensor drive circuit 511c may be electrically connected to the fingerprint sensors 530 via the second wiring lines 533 and the interlayer wiring lines 532. A second interlayer wiring line 515c may be formed on the first film 505. The second interlayer wiring line 515c may electrically connect the first wiring line 523 and the second wiring line 533. The fingerprint sensor drive circuit 511c may be electrically connected to the pixels 520 via the second wiring line 533, the second interlayer wiring line 515c, and the first wiring line 523.

Figure 29:
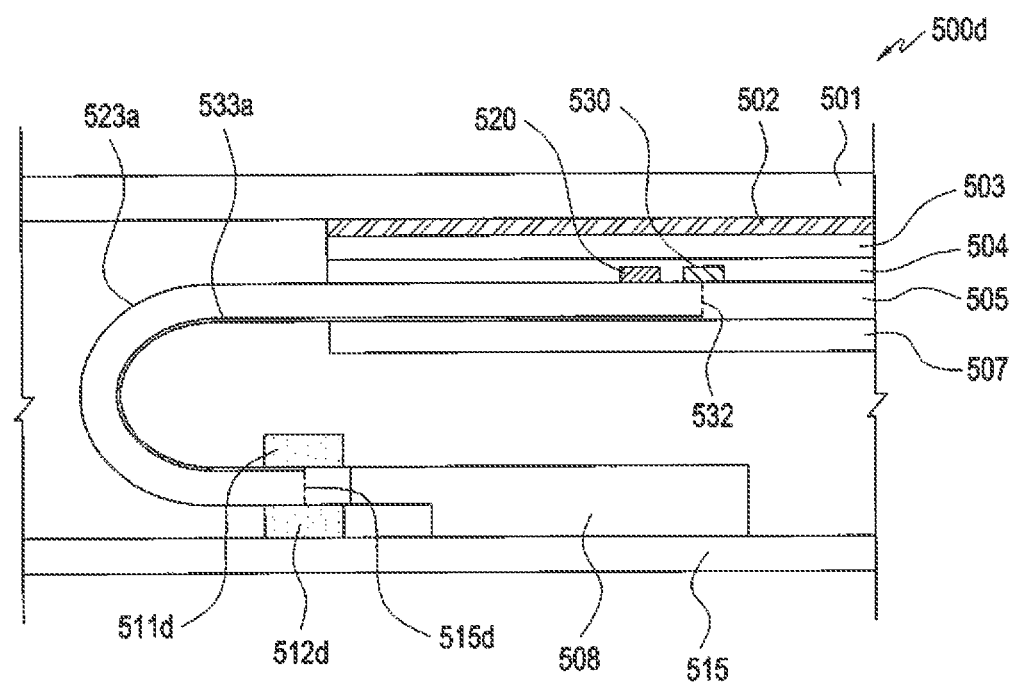
FIG. 29 is a cross-sectional view illustrating an electronic device including a display according to still another one of various embodiments of the disclosure.

FIG. 29 is a cross-sectional view illustrating an electronic device including a display according to still another one of various embodiments of the disclosure.

Referring to FIG. 29, an electronic device including a display 500d according to still another one of various embodiments of the disclosure may include a front cover 501, a touch panel 502, a polarizing layer 503, a display panel 504, pixels 520, one or more fingerprint sensors 530, a film 505, a circuit board 508, and a rear cover 515. A description of components, which are the same as or similar to the components of the preceding embodiments, will be omitted.

According to an embodiment of the disclosure, the film 505 may not be laminated with multiple layers, but may be formed as a single layer.

According to an embodiment of the disclosure, a first wiring line 523a may be disposed on the first face of the film 505, and a second wiring line 533a may be disposed on a second face of the film 505.

According to an embodiment of the disclosure, the display drive circuit 512d may be attached to the second face of the film 505. The fingerprint sensor drive circuit 511d may be attached to the first face of the film 505. Being electrically connected to the second wiring line 533a, the fingerprint sensor drive circuit 511d may be electrically connected to the fingerprint sensors 530 via the interlayer wiring line 532. Being connected to the first wiring line 523a, the display drive circuit 512d may be electrically connected to the pixels 520.

According to an embodiment of the disclosure, a second interlayer wiring line 515d may be formed on the film 505. The second interlayer wiring line 515d electrically connects the first wiring line 523 and the second wiring line 533, and thus may electrically connect the display drive circuit 512d and the fingerprint sensor drive circuit 511d.

Figure 30:
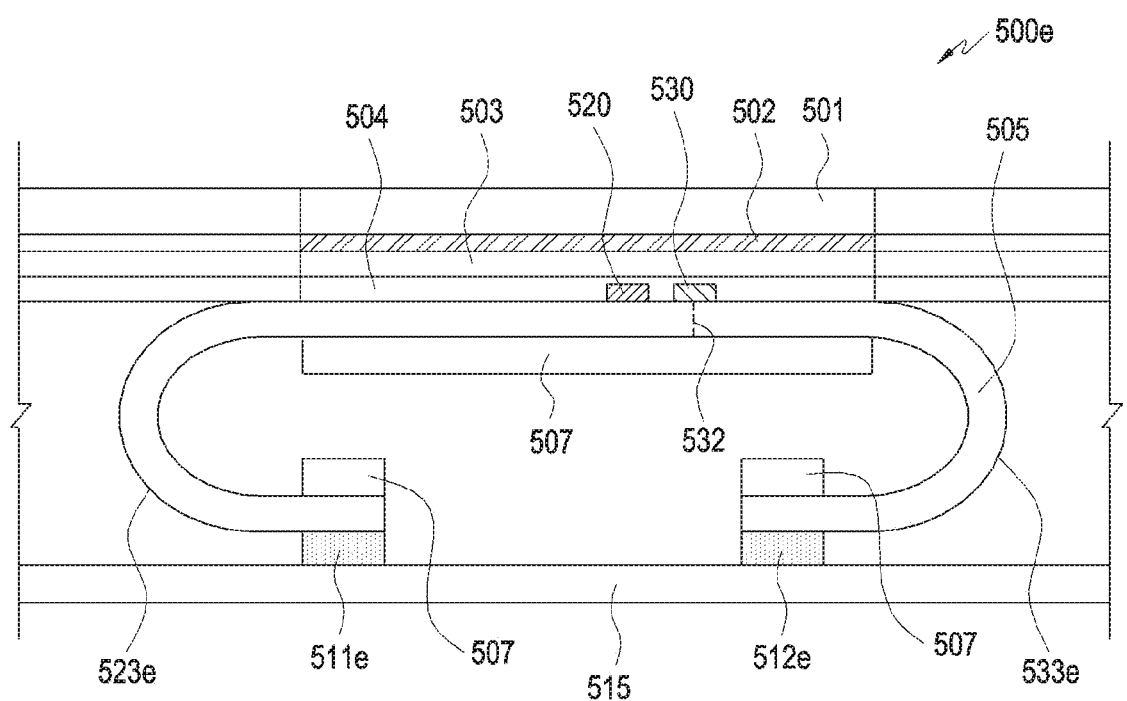
FIG. 30 is a cross-sectional view illustrating an electronic device including a display according to still another one of various embodiments of the disclosure.

FIG. 30 is a cross-sectional view illustrating an electronic device including a display according to still another one of various embodiments of the disclosure.

Referring to FIG. 30, an electronic device including a display 500e according to still another one of various embodiments of the disclosure may include a front cover 501, a touch panel 502, a polarizing layer 503, a display panel 504, pixels 520, one or more fingerprint sensors 530, a film 505, a circuit board 508, and a rear cover 515. A description of components, which are the same as or similar to the components of the preceding embodiments, will be omitted.

According to an embodiment of the disclosure, the film 505 may not be laminated in multiple layers, but may be formed as a single layer. The opposite side faces of the film 505 may be bent.

According to an embodiment of the disclosure, the first wiring line 523e may be connected to the pixels 520, and may be arranged along a first side face of first face of the film 505. The second wiring line 533e may be connected to the fingerprint sensors 530, and may be arranged along a second side face of first face of the film 505.

According to an embodiment of the disclosure, the display drive circuit 511e may be arranged on the first side face of first face of the film 505, and the fingerprint sensor driver circuit 512e may be arranged on the second side face of first face of the film 505. Being connected to the first wiring line 523e, the display drive circuit 511e may be electrically connected to the pixels 520. Being connected to the second wiring line 533e, the fingerprint sensor drive circuit 512e may be electrically connected to the fingerprint sensors 530.

FIGS. 31A to 31F are views illustrating a method for manufacturing a display according to various embodiments of the disclosure. FIG. 32 is a flowchart illustrating a method of manufacturing an electronic device including a display according to various embodiments of the disclosure.

Referring to FIGS. 31A to 31F and FIG. 32, a method of manufacturing an electronic device including a display according to various embodiments of the disclosure may include: an operation of arranging conductive lines on a film (S11); an operation of forming a TFT layer above the film through an LTPS process (S13); an operation of forming a cathode layer above the TFT layer (S15); an operation of forming interlayer wiring lines in the TFT layer or the cathode layer in order to electrically connect the TFT layer or the cathode layer to the conductive lines (S17); an operation of arranging connection lines connected to the interlayer wires (S19); an operation of arranging multiple pixels on the film (S21); an operation of arranging fingerprint sensors connected to the connection lines between multiple pixels (S23); and an operation of forming an anode layer above the multiple pixels (S25).

Figure 31A:
FIGS. 31A to 31F are views illustrating a method for manufacturing a display according to various embodiments of the disclosure.
Figure 32:
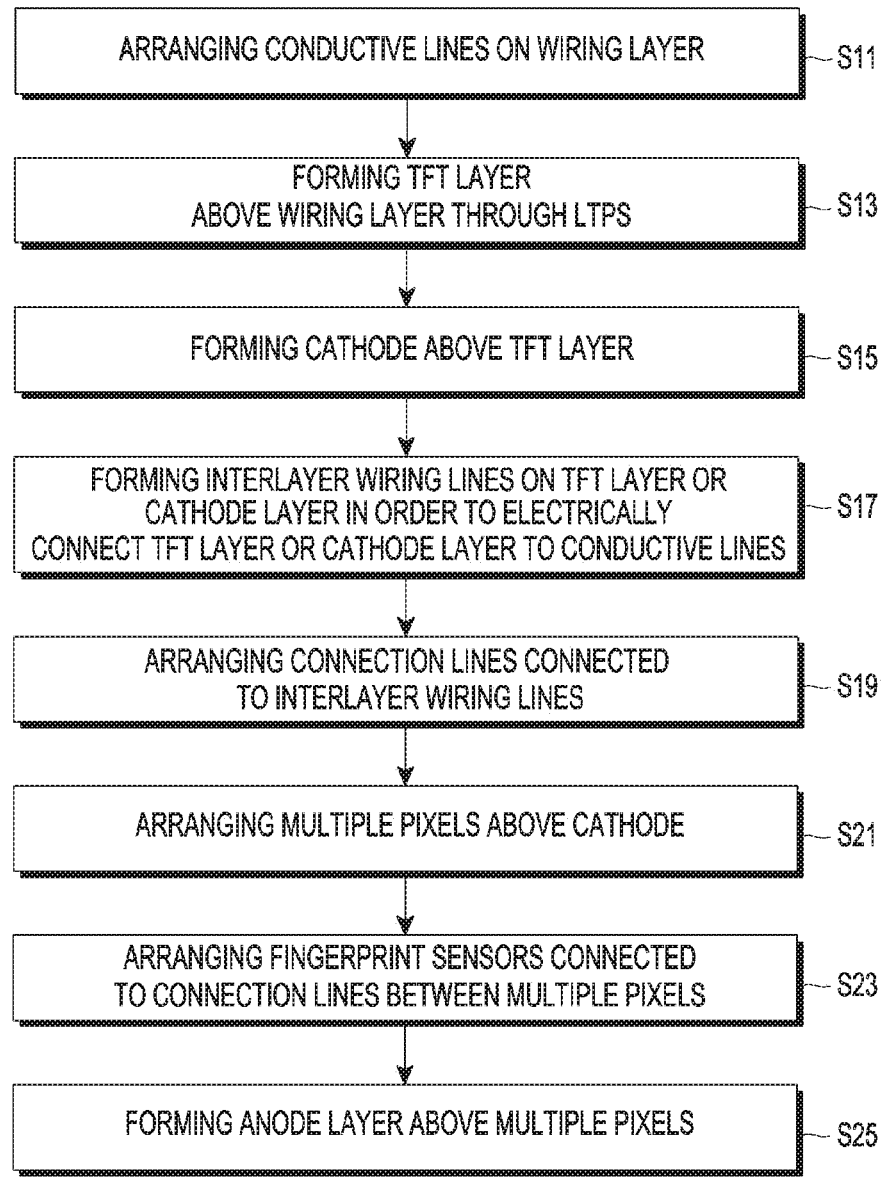
FIG. 32 is a flowchart illustrating a method of manufacturing an electronic device including a display according to various embodiments of the disclosure.

As illustrated in FIG. 31A, a film 601 may be provided.

Figure 31B:
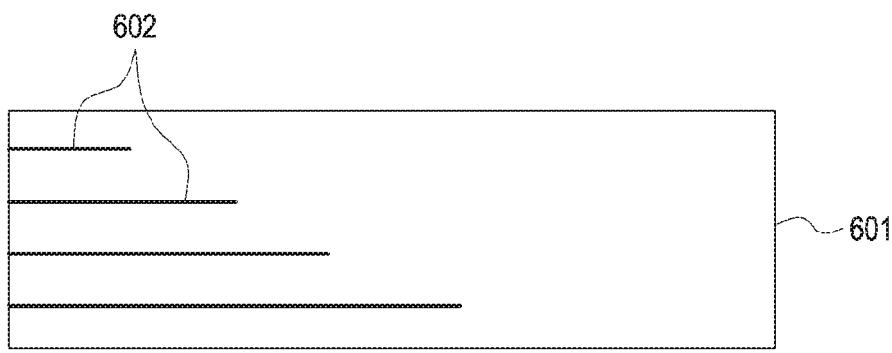
Figure 31C:
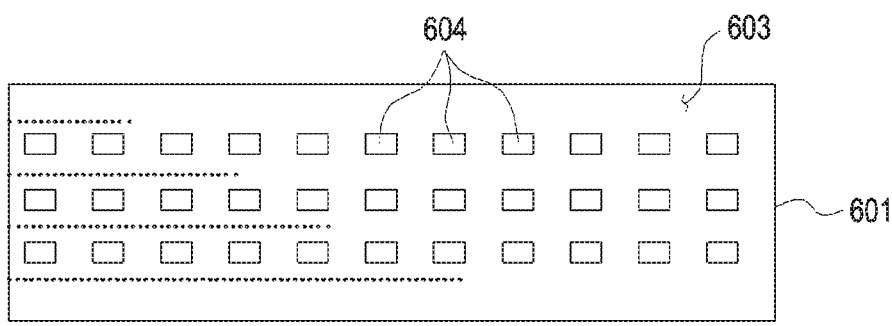

As illustrated in FIG. 31B, in the operation of arranging the conductive lines 602 on the film, the conductive lines 602 may extend from one end of the film 601 to positions where fingerprint sensors 607 to be described later are disposed. For example, the conductive lines 602 arranged on the film 601 may have different lengths.

According to an embodiment of the disclosure, in the operation of forming the TFT layer 603 above the film through the LTPS process (S13), as illustrated in FIG. 27C, TFTs may be manufactured on the film through the LTPS process.

Figure 31D:
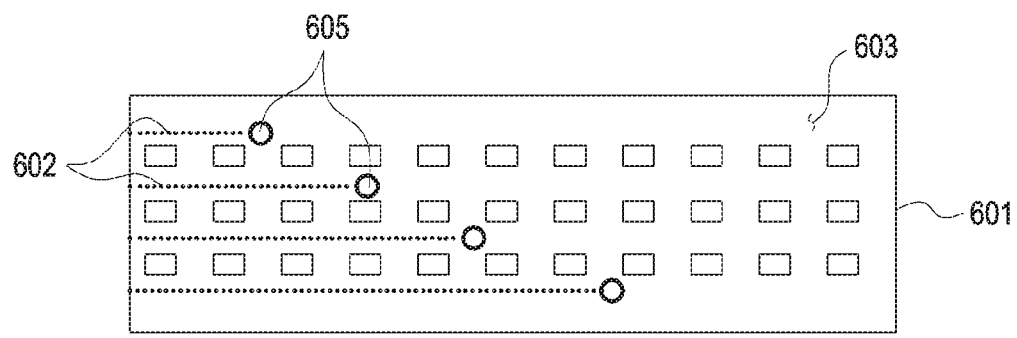

According to an embodiment of the disclosure, in the operation of forming the interlayer wiring lines 605 in the TFT layer or the cathode layer in order to electrically connect the TFT layer or the cathode layer to the conductive lines (S17), as illustrated in FIG. 31D, the interlayer wiring lines 605 may be formed at positions, which correspond to one of the ends of the conductive lines 602, respectively, through etching or the like.

Figure 31E:
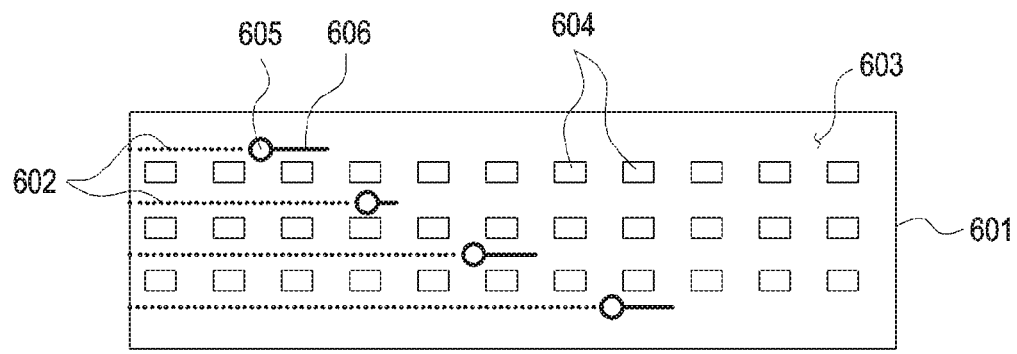

According to an embodiment of the disclosure, in the operation of arranging the connection lines 606 connected to the interlayer wiring lines 605 (S19), as illustrated in FIG. 31E, the connection lines 606 are arranged in an area in which the connection lines 606 do not overlap the TFTs 604.

Figure 31F:
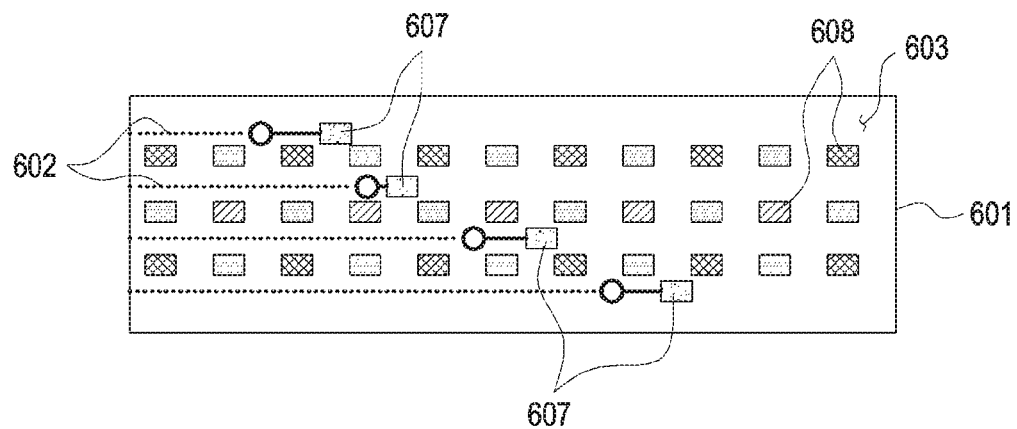

According to an embodiment of the disclosure, in the operation of arranging the multiple pixels on the film (S21), as illustrated in FIG. 31F, the multiple pixels 608 may be arranged on the TFTs 604.

According to an embodiment of the disclosure, in the operation of arranging the fingerprint sensors 607 connected to the connection lines 606 between the multiple pixels 608 (S23), as illustrated in FIG. 31F, the fingerprint sensors 607 may be electrically connected to the conductive lines 602 of the film 601 via the interlayer wiring lines 602.

According to an embodiment of the disclosure, an electronic device includes a display, and the display may include: a display panel including one or more first pixels, one or more second pixels, one or more first wiring lines connected to the one or more first pixels and the one or more second pixels, and one or more fingerprint sensors disposed between the one or more first pixels and the one or more second pixels; and a wiring layer including one or more second wiring lines connected to the one or more fingerprint sensors.

According to an embodiment of the disclosure, the electronic device may further include a display drive circuit connected to the first wiring lines.

According to an embodiment of the disclosure, the electronic device may further include a fingerprint sensor drive circuit connected to the second wiring lines.

According to an embodiment of the disclosure, the wiring layer may include an extension area extending to an outside of the display panel, and the fingerprint sensor drive circuit may be disposed on the extension area.

According to an embodiment of the disclosure, the wiring layer may be made of a film enclosing one face of the display panel.

According to an embodiment of the disclosure, the first wiring lines may not be disposed on the wiring layer.

According to an embodiment of the disclosure, the wiring layer may be disposed between multiple layers forming the display panel.

According to an embodiment of the disclosure, the electronic device may further include a film disposed on a lower face of the display panel. The film may include a first film in which the one or more interlayer wiring lines included in the one or more second wiring lines are disposed, and a second film disposed at a side opposite the side on which the first film is disposed, with the wiring layer interposed therebetween. The one or more second wiring lines may connect the one or more fingerprint sensors and the fingerprint sensor drive circuit via the one or more interlayer wiring lines and the wiring layer.

According to an embodiment of the disclosure, the display panel may be one of an OLED panel or an LCD panel.

According to an embodiment of the disclosure, the display panel may include: a Thin Film Transistor (TFT) layer disposed above the wiring layer; a cathode layer disposed above the TFT layer; a light-emitting layer disposed above the cathode layer and including multiple pixels arranged thereon; an anode layer disposed above the light-emitting layer; a transparent plate disposed above the anode layer; and a fingerprint sensor drive circuit disposed on one face of the wiring layer. The second wiring lines may connect the fingerprint sensors to the fingerprint sensor drive circuit.

According to an embodiment of the disclosure, the fingerprint sensors may be disposed above the light-emitting layer.

According to an embodiment of the disclosure, the fingerprint sensors may be composed of electrodes made of an opaque material.

According to an embodiment of the disclosure, the opaque material may include at least one of copper (Cu), titanium (Ti), molybdenum (Mo), or aluminum (Al).

According to an embodiment of the disclosure, the fingerprint sensors may be disposed below the light-emitting layer.

According to an embodiment of the disclosure, the fingerprint sensors may be composed of electrodes made of a transparent material.

According to an embodiment of the disclosure, the fingerprint sensors may be composed of electrodes containing at least one of Indium-Zinc-Oxide (ITO), Indium-Zinc-Oxide (IZO), an Ag nanowire, or a mesh-type metal.

According to an embodiment of the disclosure, the multiple fingerprint sensors may be disposed on the anode layer.

According to an embodiment of the disclosure, the multiple fingerprint sensors may be disposed on the cathode layer.

According to an embodiment of the disclosure, the multiple fingerprint sensors may be disposed above the cathode layer.

According to an embodiment of the disclosure, the multiple fingerprint sensors may be disposed on the upper face of the transparent plate.

According to an embodiment of the disclosure, the multiple fingerprint sensors may be disposed between the anode layer and the wiring layer.

According to an embodiment of the disclosure, the electronic device may include: a window; a display panel disposed on a lower face of the window and including multiple pixels; multiple fingerprint sensors provided in the display panel and arranged between the multiple pixels; a wiring layer disposed on a lower face of the display panel and including second wiring lines connected to the multiple fingerprint sensors; and a fingerprint sensor drive circuit connected to the multiple fingerprint sensors via the second wiring lines.

According to an embodiment of the disclosure, the electronic device may further include interlayer wiring lines formed in the wiring layer and disposed in an active area on which a screen is displayed in the display panel, and the interlayer wiring lines may electrically connect the fingerprint sensors and the fingerprint sensor drive circuit.

According to an embodiment of the disclosure, the electronic device may further include interlayer wiring lines formed in the wiring layer and disposed in an inactive area on which no screen is displayed in the display panel, and the interlayer wiring lines may electrically connect the fingerprint sensors and the fingerprint sensor drive circuit.

According to an embodiment of the disclosure, a method of manufacturing an electronic device having a fingerprint recognition function may include: an operation of arranging conductive lines on a wiring layer; an operation of forming a TFT layer above the wiring layer through an LTPS process; an operation of forming a cathode layer above the TFT layer; an operation of forming interlayer wiring lines in the TFT layer or the cathode layer in order to electrically connect the TFT layer or the cathode layer to the conductive lines; an operation of arranging connection lines connected to the interlayer wires; an operation of arranging multiple pixels on the wiring layer; an operation of arranging fingerprint sensors connected to the connection lines between the multiple pixels; and an operation of forming an anode layer above the multiple pixels.

While the disclosure has been shown and described with reference to certain embodiments thereof, it will be understood by those skilled in the art that various changes in form and details may be made therein without departing from the spirit and scope of the disclosure as defined by the appended claims.

The invention claimed is:
1. An electronic device comprising a display,
wherein the display comprises:
a display panel comprising one or more first pixels, one or more second pixels, one or more first wiring lines connected to the one or more first pixels and the one or more second pixels, and one or more fingerprint sensors disposed between the one or more first pixels and the one or more second pixels;
a wiring layer comprising one or more second wiring lines connected to the one or more fingerprint sensors via one or more interlayer wiring lines passing through a plurality of layers formed in the display; and
a film disposed on a lower face of the display panel, the film comprising:
a first film in which the one or more interlayer wiring lines included in the one or more second wiring lines are disposed, and a second film disposed at a side opposite a side on which the first film is disposed, with the wiring layer interposed therebetween, wherein the one or more second wiring lines connect the one or more fingerprint sensors and a fingerprint sensor drive circuit via the one or more interlayer wiring lines and the wiring layer, and wherein the one or more interlayer wiring lines are formed in an inactive area of the display.

2. The electronic device of claim 1, further comprising:
a fingerprint sensor drive circuit connected to the one or more second wiring lines,
wherein the wiring layer comprises an extension area extending to an outside of the display panel, and
the fingerprint sensor drive circuit is disposed on the extension area.

3. The electronic device of claim 1, wherein the one or more first wiring lines are not disposed on the wiring layer.

4. The electronic device of claim 1, wherein the wiring layer is disposed in any one space between multiple layers forming the display panel.

5. The electronic device of claim 1, wherein the display panel comprises:
a thin film transistor (TFT) layer disposed above the wiring layer;
an anode layer disposed above the TFT layer;
a light-emitting layer disposed above the anode layer and having multiple pixels arranged thereon;
a cathode layer disposed above the light-emitting layer;
a transparent plate disposed above the cathode layer; and
a fingerprint sensor drive circuit disposed on one face of the wiring layer,
wherein the one or more second wiring lines connect the one or more fingerprint sensors to the fingerprint sensor drive circuit.

6. The electronic device of claim 5, wherein the one or more fingerprint sensors are disposed above the light-emitting layer.

7. The electronic device of claim 5, wherein the one or more fingerprint sensors are disposed below the light-emitting layer.

8. The electronic device of claim 5, wherein the one or more fingerprint sensors comprise electrodes formed of a transparent material, and the one or more fingerprint sensors comprise electrodes containing at least one of indium-tin-oxide (ITO), indium-zinc-oxide (IZO), an Ag nanowire, or a mesh-type metal.

9. The electronic device of claim 5, wherein the one or more fingerprint sensors are disposed on the anode layer.

10. The electronic device of claim 5, wherein the one or more fingerprint sensors are disposed on the cathode layer.

11. The electronic device of claim 5, wherein the one or more fingerprint sensors are disposed above the cathode layer.

12. The electronic device of claim 5, wherein the one or more fingerprint sensors are disposed on an upper face of the transparent plate.

13. The electronic device of claim 5, wherein the one or more fingerprint sensors are disposed between the anode layer and the wiring layer.

14. An electronic device comprising:
a window;
a film disposed on a lower face of the display; and
a display comprising:
a display panel disposed on a lower face of the window and comprising multiple pixels;
multiple fingerprint sensors provided in the display panel and arranged between the multiple pixels;
a wiring layer disposed on a lower face of the display panel and comprising second wiring lines connected to the multiple fingerprint sensors via multiple interlayer wiring lines passing through multiple layers formed in the display; and
a fingerprint sensor drive circuit connected to the multiple fingerprint sensors via the second wiring lines,
wherein the multiple interlayer wiring lines are formed in an inactive area of the display,
wherein the film comprises:
a first film in which the one or more interlayer wiring lines included in the one or more second wiring lines are disposed, and
a second film disposed at a side opposite a side on which the first film is disposed, with the wiring layer interposed therebetween, and
wherein the one or more second wiring lines connect the one or more fingerprint sensors and a fingerprint sensor drive circuit via the one or more interlayer wiring lines and the wiring layer.

* * * * *